(12) United States Patent
Gong et al.

(10) Patent No.: US 12,381,474 B2
(45) Date of Patent: Aug. 5, 2025

(54) VOLTAGE GENERATOR WITH LOW CLOCK FEEDTHROUGH

(71) Applicant: Skyworks Solutions, Inc., Irvine, CA (US)

(72) Inventors: Jingfeng Gong, Singapore (SG); William Frede, Central City, IA (US); Yeung Bun Choi, Singapore (SG)

(73) Assignee: Skyworks Solutions, Inc., Irvine, CA (US)

( * ) Notice: Subject to any disclaimer, the term of this patent is extended or adjusted under 35 U.S.C. 154(b) by 118 days.

(21) Appl. No.: 18/353,458

(22) Filed: Jul. 17, 2023

(65) Prior Publication Data
US 2024/0022164 A1    Jan. 18, 2024

Related U.S. Application Data

(60) Provisional application No. 63/368,743, filed on Jul. 18, 2022, provisional application No. 63/368,729, filed on Jul. 18, 2022, provisional application No. 63/368,733, filed on Jul. 18, 2022.

(51) Int. Cl.
| | |
|---|---|
| *H02M 3/07* | (2006.01) |
| *H02M 1/00* | (2006.01) |
| *H02M 1/096* | (2006.01) |
| *H02M 1/44* | (2007.01) |
| *H02M 3/158* | (2006.01) |
| *H03K 17/687* | (2006.01) |
| *H03K 19/0185* | (2006.01) |

(52) U.S. Cl.
CPC ......... *H02M 1/096* (2013.01); *H02M 1/0022* (2021.05); *H02M 1/44* (2013.01); *H02M 3/071* (2021.05); *H02M 3/1586* (2021.05); *H03K 17/6871* (2013.01); *H03K 19/01855* (2013.01); *H02M 1/0006* (2021.05)

(58) Field of Classification Search
None
See application file for complete search history.

(56) References Cited

U.S. PATENT DOCUMENTS

| | | | | |
|---|---|---|---|---|
| 6,411,531 | B1 * | 6/2002 | Nork | H02M 3/073 363/60 |
| 6,429,632 | B1 * | 8/2002 | Forbes | H02M 3/07 363/59 |

(Continued)

*Primary Examiner* — Jeffrey S Zweizig
(74) *Attorney, Agent, or Firm* — Knobbe, Martens, Olson & Bear, LLP

(57) ABSTRACT

Voltage generators with relatively low clock feedthrough are disclosed. A voltage generator can include a charge pump with a first set of two switches arranged between two voltages, a second set of two switches arranged between one of the two voltages and an output node, and a fly capacitor connected to the first and second sets of two switches. The voltage generator can include a clock generation circuit to provide clock signals such that the two switches of the first set transition state and the two switches of the second set transition state at different times. In certain embodiments, the charge pump includes a p-type fly capacitor connected to an output node by way of an n-type transistor. In some embodiments, a level shifter can generate a level shifted clock signal for the charge pump and includes cross coupled transistors to receive a regulated voltage provided to the voltage generator.

20 Claims, 21 Drawing Sheets

(56) References Cited

U.S. PATENT DOCUMENTS

| | | | |
|---|---|---|---|
| 6,518,829 B2 * | 2/2003 | Butler | H02M 3/073 |
| | | | 363/60 |
| 6,803,807 B2 * | 10/2004 | Fujiyama | H02M 3/07 |
| | | | 327/536 |
| 6,804,502 B2 | 10/2004 | Burgener et al. | |
| 7,719,343 B2 | 5/2010 | Burgener | |
| 8,537,579 B2 | 9/2013 | Ripley et al. | |
| 9,111,601 B2 | 8/2015 | Cassina | |
| 9,136,795 B2 | 9/2015 | Liu et al. | |
| 9,467,124 B2 | 10/2016 | Crandall | |
| 9,621,034 B2 | 4/2017 | Liu et al. | |
| 10,749,512 B2 | 8/2020 | Balteanu et al. | |
| 11,190,182 B2 | 11/2021 | Balteanu et al. | |
| 11,431,357 B2 * | 8/2022 | Balteanu | H04B 1/0458 |
| 2011/0018619 A1 * | 1/2011 | Cassia | H02M 3/07 |
| | | | 327/537 |

* cited by examiner

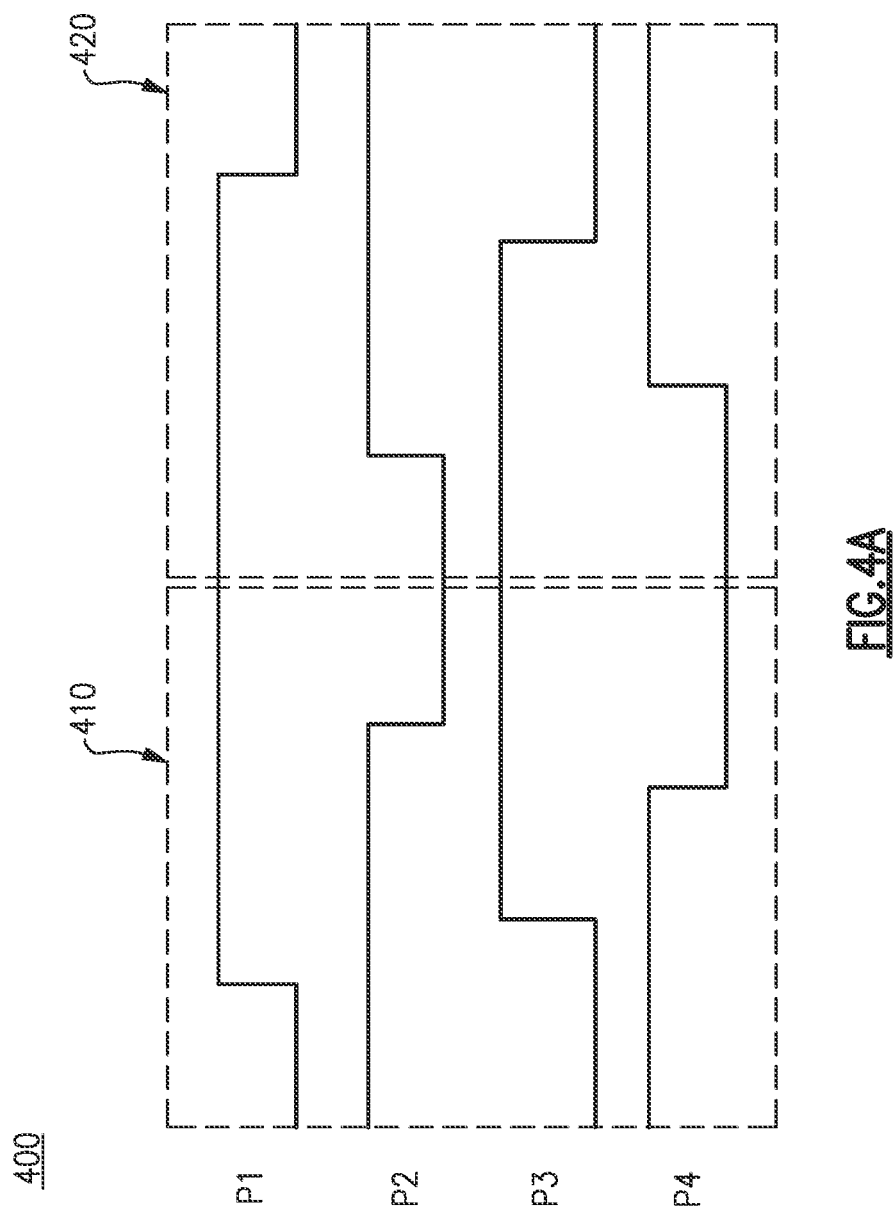

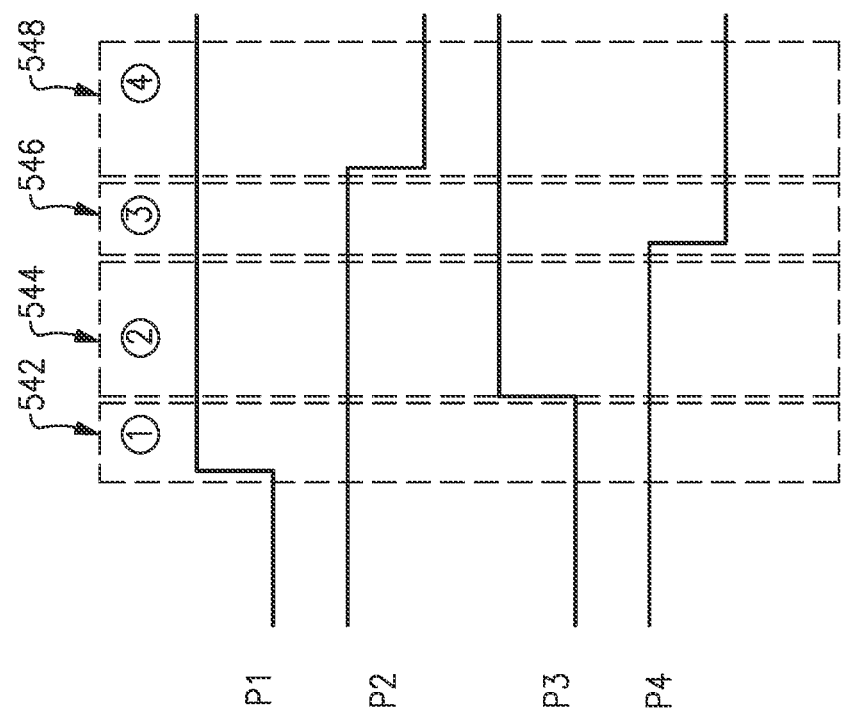

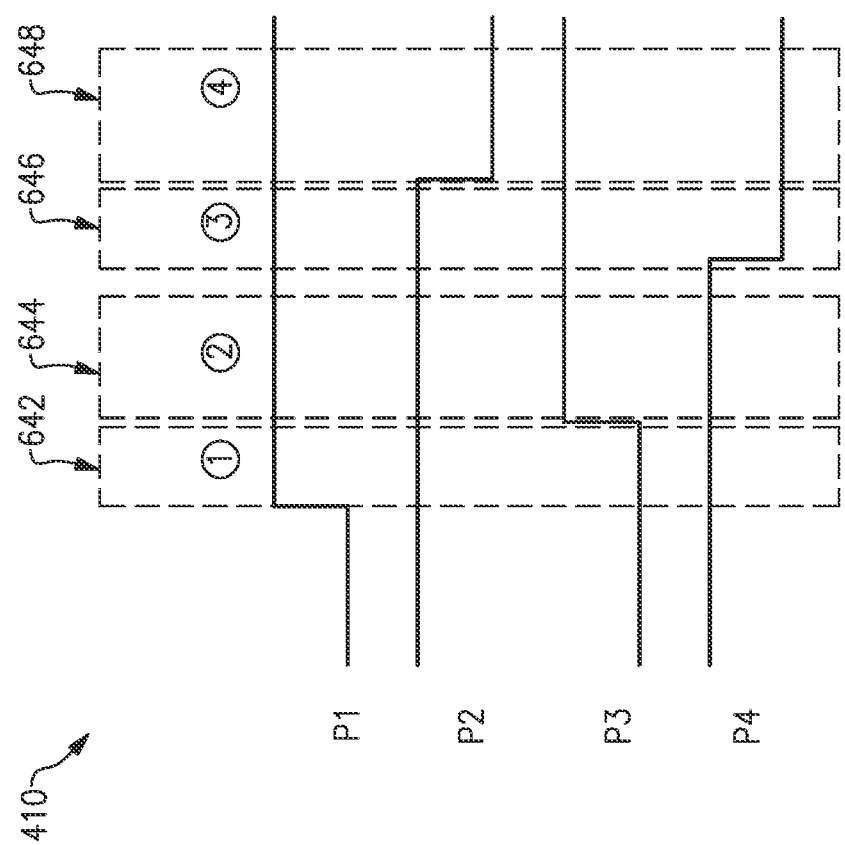

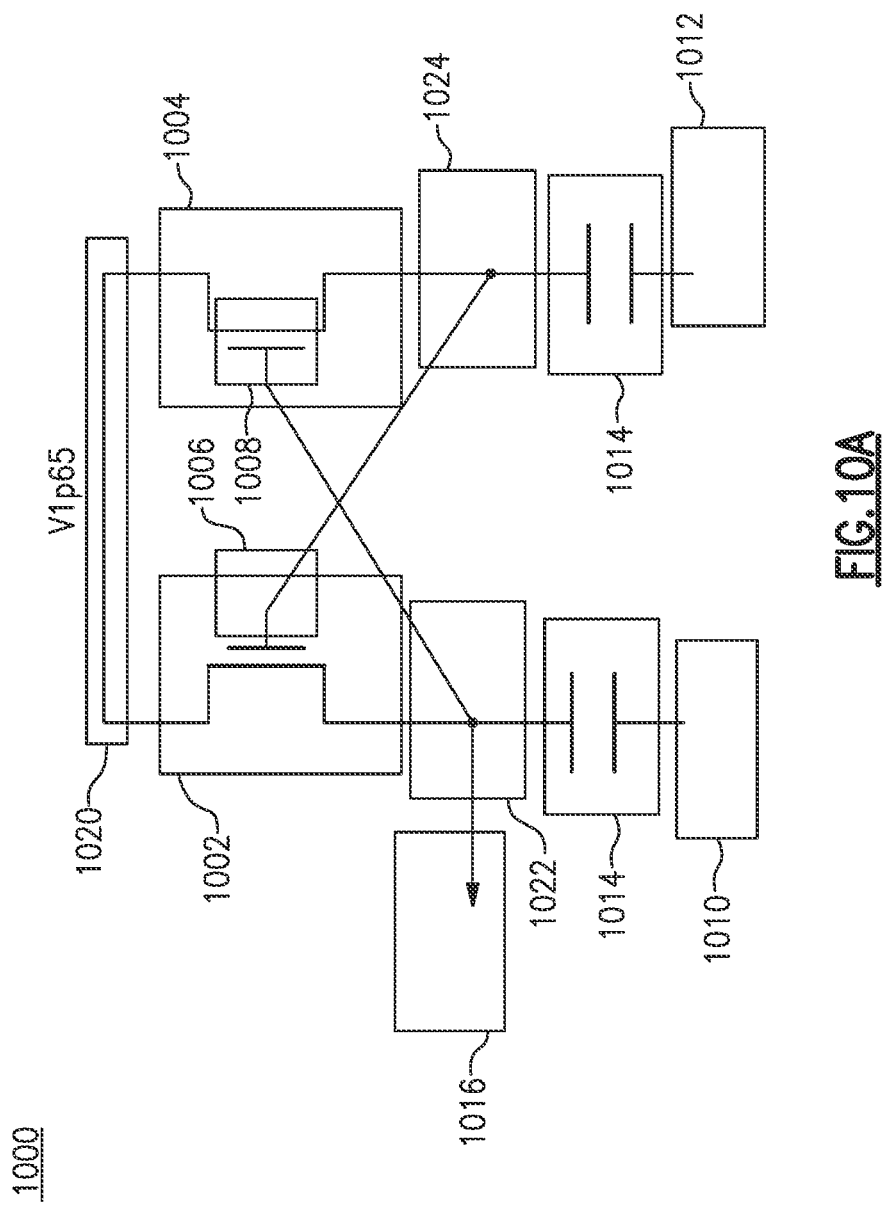

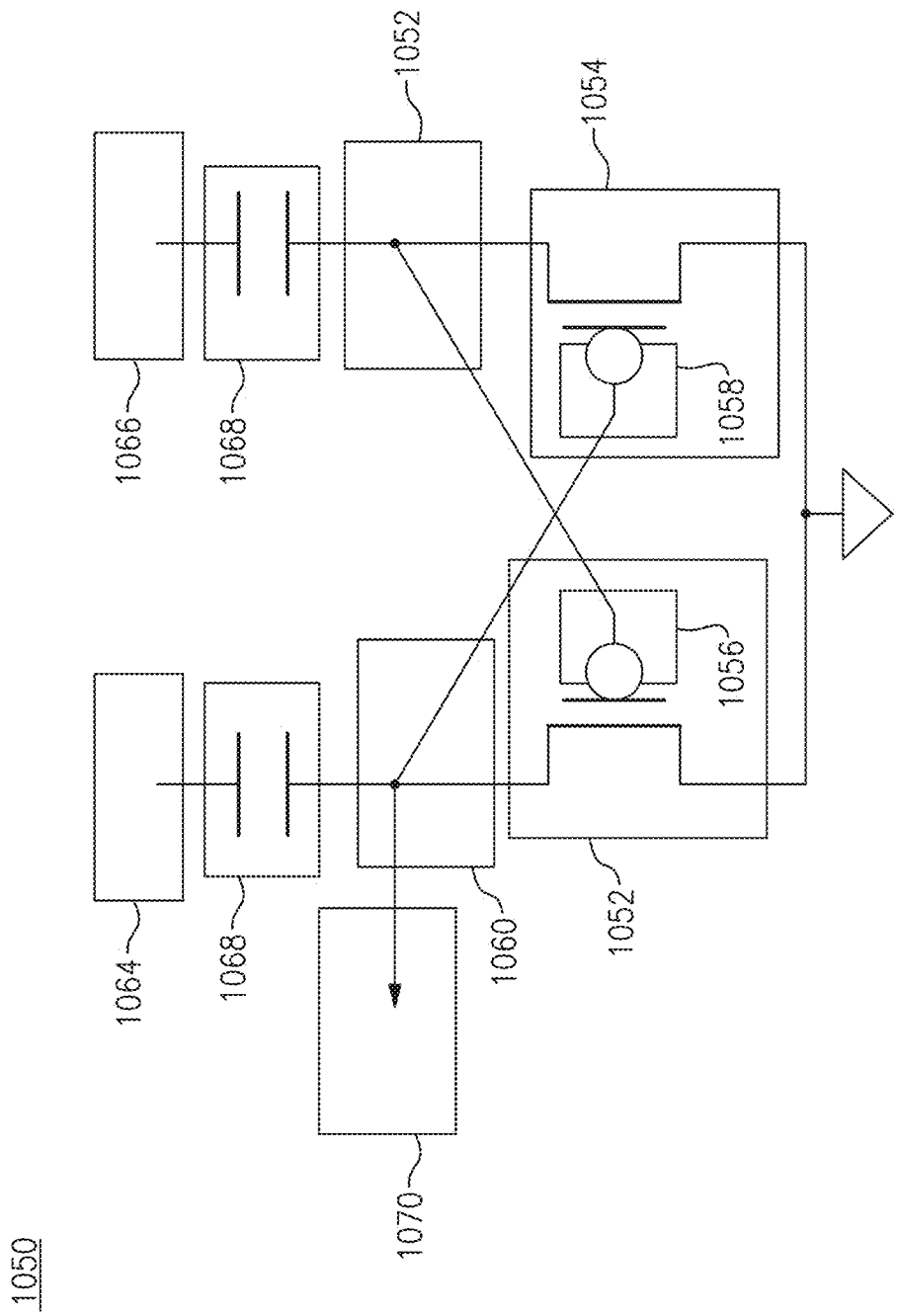

VOLTAGE GENERATOR WITH LOW CLOCK FEEDTHROUGH

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/368,729, filed Jul. 18, 2022, and titled "VOLTAGE GENERATOR WITH LOW CLOCK FEEDTHROUGH," U.S. Provisional Application No. 63/368,743, filed Jul. 18, 2022 and titled "NEGATIVE VOLTAGE GENERATOR WITH P-TYPE FLY CAPACITOR," and U.S. Provisional Application No. 63/368,733, filed Jul. 18, 2022, and titled "POSITIVE VOLTAGE GENERATOR WITH LOW NOISE LEVEL SHIFTER," the disclosures of each of which are hereby incorporated by reference in their entireties and for all purposes.

BACKGROUND

Technical Field

Embodiments of this disclosure relate to voltage generators.

Description of Related Technology

Radio frequency (RF) switches can be used in a variety of applications. For example, RF switches can be integrated into an RF front end system. An operating frequency band of the RF front end system can be selected by controlling the RF switches. To control the RF switches, a voltage generator can provide the control signals. This can involve generating a positive voltage or a negative voltage to turn on and off the RF switches. The voltage generators can use charge pumps to generate positive and negative voltages. For example, for N-type switches, a positive voltage charge pump can generate a positive voltage to turn on an N-type switch, and a negative voltage charge pump can generate a negative voltage to turn off the N-type switch. Based on the positive and negative voltages generated from the charge pump, the voltage generator can control the RF switches by turning on or off the switches.

Examples of RF communication systems include, but are not limited to, mobile phones, tablets, base stations, network access points, customer-premises equipment (CPE), laptops, and wearable electronics.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a voltage generator with low noise. The voltage generator includes a charge pump and a clock generation circuit. The charge pump includes a first set of two switches arranged between two voltages, a second set of two switches arranged between one of the two voltages and an output node, and a fly capacitor connected to the first set of two switches and the second set of two switches. The clock generation circuit provides clock signals to the charge pump such that (i) the two switches of the first set transition state at different times and (ii) the two switches of the second set transition state at different times.

The clock signals can include a first phase and a second phase.

The clock signals can include four clock signals provided to the first and second sets of two switches, and only one of the four clock signals transitions at a time.

The clock signals can cause a first switch of the first set of two switches to transition state only when a second switch of the first set of two switches is in an off state.

The two switches of the first set can include an N-type switch and a P-type switch. Additionally, the clock generation circuit can include a level shifter that can generate a level shifted clock signal of at least one of the clock signals. The level shifter can also include cross coupled P-type transistors that can provide the level shifted clock signal at their drains. Furthermore, the two voltages can be a power supply voltage and ground. Additionally, the second set of two switches can be connected between ground and the output node.

The charge pump can generate a negative output voltage.

The fly capacitor can include a P-type field effect transistor arranged as a capacitor. Additionally, the second set of two switches can include an N-type transistor connected between the fly capacitor and the output node.

The charge pump can generate a positive output voltage. Additionally, the clock generation circuit can include a level shifter. The level shifter can generate a level shifted clock signal of at least one of the clock signals. The level shifter can also include cross coupled N-type transistors. The N-type transistors can receive a regulated voltage. The regulated voltage can be provided to the voltage generator as a supply voltage. The fly capacitor can include a N-type field effect transistor arranged as a capacitor. The P-type transistor of the second set of two switches can be connected between the fly capacitor and the output node. The two voltages can be a power supply voltage and ground. Furthermore, the second set of two switches can be connected between the power supply voltage and the output node.

The voltage generator can include a level shifter. The level shifter can level shift one of the clock signals and generate another one of the clock signals.

The charge pump can include a third set of two switches, a fourth set of two switches, and a second fly capacitor connected to the third set of two switches and the fourth set of two switches. The second fly capacitor can be connected to the output node by way of a switch of the fourth set of two switches.

The fly capacitor can include a metal-oxide-semiconductor transistor arranged as a capacitor.

Another aspect of this disclosure is a radio frequency system that includes a voltage generator, a switch driver, and a radio frequency switch. The voltage generator includes a charge pump and a clock generation circuit. The charge pump includes a first set of two switches arranged between two voltages, a second set of two switches arranged between one of the two voltages and an output node, and a fly capacitor connected to the first set of two switches and the second set of two switches. The clock generation circuit provides clock signals to the charge pump such that (i) the two switches of the first set transition state at different times and (ii) the two switches of the second set transition state at different times.

The voltage generator can include one or more features of voltages generators disclosed herein.

The radio frequency switch can be included in a signal path between a power amplifier and a filter.

The radio frequency switch can also be included in a signal path between a low noise amplifier and a filter.

The radio frequency switch can also be included in a signal path between filter and an antenna port.

The radio frequency system can include a plurality of additional radio frequency switches. The plurality of additional radio frequency switches can receive control signals from the switch driver.

The switch driver can perform level shifting.

The radio frequency switch can include a silicon-on-insulator transistor.

Another aspect of this disclosure is a wireless communication device that includes the above radio frequency system and an antenna operatively coupled to the radio frequency switch of the radio frequency system.

The wireless communication device can include a mobile phone.

Another aspect of this disclosure is a method of controlling a radio frequency switch. The method includes generating a voltage using the above voltage generator and driving a radio frequency switch with a control signal that is based on the voltage to toggle a state of the radio frequency switch.

Another aspect of this disclosure is a negative voltage charge pump that includes a first set of switches arranged between a supply voltage and a ground potential, a second set of switches arranged between the ground potential and an output node, and a P-type fly capacitor connected to the first set of switches and the second set of switches. The first set of switches includes a first N-type switch and a first P-type switch. The second set of switches includes a second N-type switch and a second P-type switch. The second N-type switch is connected between the P-type fly capacitor and the output node, and the negative voltage charge pump outputs a negative voltage.

A negative terminal of the P-type fly capacitor can be connected to a node between the second N-type switch and second P-type switch.

A positive terminal of the P-type fly capacitor can be connected to a node between the first N-type switch and first P-type switch.

The first N-type switch can be connected between ground and an intermediate node. Additionally, the first P-type switch can be connected between the intermediate node and a power supply voltage. The first set of switches can be connected to the P-type fly capacitor at the intermediate node.

The P-type fly capacitor can include a field effect transistor having a source connected to a drain.

The P-type fly capacitor can include a P-type metal oxide semiconductor field effect transistor. Additionally, the P-type metal oxide semiconductor field effect transistor can have a gate connected to the second set of switches. The P-type metal oxide semiconductor field effect transistor can also have a source and a drain connected to each other and the first set of switches.

Additionally, the negative voltage charge pump can include a clock generation circuit. The clock generation circuit can provide clock signals to the first and second sets of switches such that (i) each switch of the first set of switches transitions state at a different time and (ii) each switch of the second set of switches transitions state at a different time.

The negative voltage charge pump can further include a clock generation circuit. The clock generation circuit can provide four clock signals to the first and second sets of switches such that only one of the four clock signals transitions at a time. Additionally, the clock generation circuit can include a level shifter. The level shifter can generate a level shifted clock signal of at least one of the four clock signals. The level shifter can include a pair of cross coupled P-type transistors that can provide the level shifted clock signal at their drains.

Another aspect of this disclosure is a radio frequency system that includes a negative voltage charge pump, a switch driver, and a radio frequency switch. The negative voltage charge pump includes a first set of switches, a second set of switches, a P-type fly capacitor connected to the first set of switches and the second set of switches, an N-type switch being connected between the P-type fly capacitor and an output node of the negative voltage charge pump, and the negative voltage charge pump configured to output a negative voltage at the output node. The switch driver receives the negative voltage from the negative voltage charge pump and outputs a control signal. The radio frequency switch toggles state based on the control signal and passes a radio frequency signal.

The negative voltage charge pump can include one or more additional features included in the above negative voltage charge pump.

The radio frequency switch can be included in a signal path between a power amplifier and a filter.

The radio frequency switch can also be included in a signal path between a low noise amplifier and a filter.

The radio frequency switch can also be included in a signal path between filter and an antenna port.

The radio frequency system can further include a plurality of additional radio frequency switches. The plurality of additional radio frequency switches can receive control signals from the switch driver.

The radio frequency switch can include a silicon-on-insulator transistor.

Another aspect of this disclosure is a positive voltage generator that includes a clock generation circuit and a charge pump. The clock generation circuit includes clock generating circuitry and a level shifter. The clock generating circuitry generates first clock signals, and the level shifter generates a level shifted clock signal from at least one of the first clock signals. The level shifter includes a pair of cross coupled N-type transistors, and the N-type transistors receives a regulated voltage provided to the positive voltage generator as a supply voltage. The charge pump receives the first clock signals and the level shifted clock signal, and the positive voltage generator outputs a positive voltage.

The level shifter can be a voltage doubler.

The clock signals can include a first phase clock signals and a second phase clock signals.

The level shifter can include a first capacitor and a second capacitor. The level shifter can receive the one of the clock signals via the first capacitor and a logical complement of the one of the clock signals via the second capacitor.

The first transistor of the N-type transistors of the pair of cross-coupled N-type transistors can be a first N-type field effect transistor having a source connected to the first capacitor. The second transistor of the N-type transistors of the pair of cross-coupled N-type transistors can be a second N-type field effect transistor having a source connected to the second capacitor.

The level shifter can provide the level shifted clock signal at drains of the cross coupled N-type transistors.

The clock signals can include four clock signals, and the clock generating circuitry can generate the four clock signals such that only one of the four clock signals transitions at a time.

The charge pump can include a first set switches arranged between a supply voltage and a ground potential, a second set of switches arranged between the supply voltage and an output node, and a fly capacitor connected to the first set of switches and the second set of switches.

The clock generation circuit can provide the level shifted clock signal to a switch of the second set of switches that is connected between the fly capacitor and the output node.

The switch of the second set of switches that is connected between the fly capacitor and the output node can be a P-type transistor.

The clock generation circuit can provide the level shifted clock signal and a subset of the clock signals to the first and second sets of switches such that (i) each switch of the first set of switches transitions state at a different time and (ii) each switch of the second set of switches transitions state at a different time.

Another aspect of this disclosure is a radio frequency system that includes a positive voltage generator, a switch driver, and a radio frequency switch. The positive voltage generator receives a regulated voltage and outputs a positive voltage. The positive voltage generator includes a clock generation circuit and a charge pump. The clock generation circuit includes a level shifter that generates a level shifted clock signal. The level shifter also includes a pair of cross coupled N-type transistors that receive the regulated voltage as a supply voltage. The switch driver receives the positive voltage from the positive voltage generator and outputs a control signal. The radio frequency switch toggles state based on the control signal and passes a radio frequency signal.

The positive voltage generator can include one or more additional features pf positive voltage generators disclosed herein.

The radio frequency switch can be in a signal path between a power amplifier and a filter.

The radio frequency switch can be included in a signal path between a low noise amplifier and a filter.

The radio frequency switch can also be included in a signal path between filter and an antenna port.

The radio frequency system can further include a plurality of additional radio frequency switches that can receive control signals from the switch driver.

The radio frequency switch can include a silicon-on-insulator transistor.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 4A is an example of charge pump input clock signals according to an embodiment.

FIG. 5B illustrates examples of clock signals for controlling the negative voltage charge pump during first phase.

FIG. 6B illustrates examples of clock signals for controlling the positive voltage charge pump charge pump during first phase.

FIG. 10A is a schematic diagram of an example positive level shifter circuit used to generate a level shifted clock signal as input signal for a switch included in to positive voltage charge pump.

FIG. 10B is a schematic diagram of an example negative level shifter circuit used to generate a level shifted clock signal as an input signal for a switch included in a negative voltage charge pump.

DETAILED DESCRIPTION OF CERTAIN EMBODIMENTS

Figure 1:
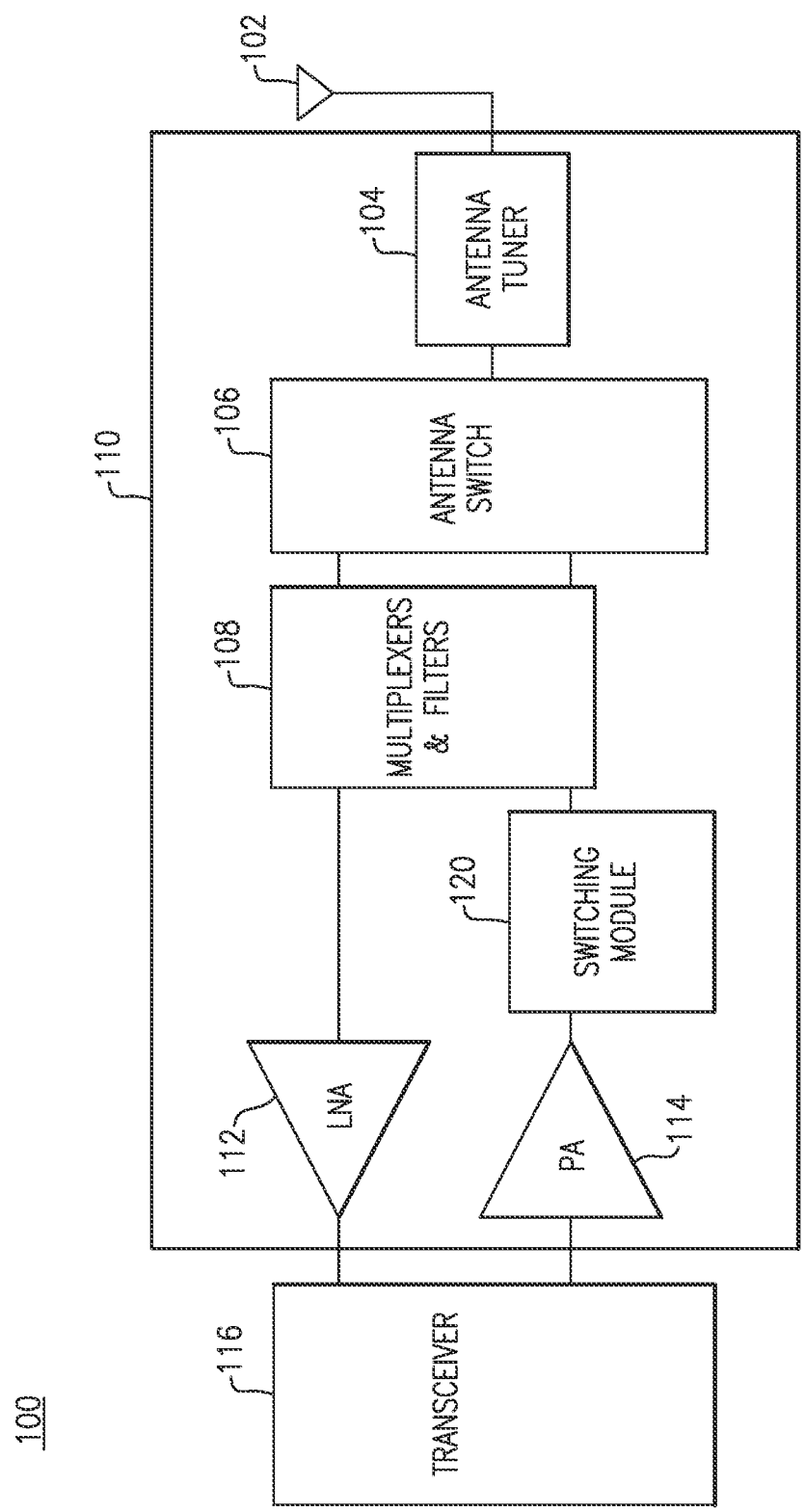
FIG. 1 is an example diagram for utilizing a radio frequency (RF) switch to select an operating frequency band of a wireless communication system.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As the demand for integrating silicon-on-insulator (SOI) switches in a radio frequency (RF) front end system or to an integrated circuit (IC) increases, a control system for controlling the RF switches with reduced and/or minimum noise associated with the control signals to the RF switches is desired. A voltage generator can be used to generate the control signals for the RF switches. The voltage generator can include one or more charge pumps to generate desired voltages to control the RF switches. The voltage generator can also include a clock generation circuit and a level shifter. RF switches disclosed herein can be implemented by SOI transistors.

Charge pumps can generate clock feedthrough (CFT) noise with the control signal. Thus, a charge pump generating a control signal with low CFT noise is desirable. However, developing the charge pump with low CFT noise can be challenging. For example, certain filters into the communication paths between the controller system and the RF switches to reduce CFT noise have been implemented. However, such filters can introduce performance degradation, such as slower switching time compared to utilizing the controller system without such filters. The slower switching time can be a significant performance degradation factor in a wireless communication device operating at a high frequency, such as certain wireless communication devices in fifth generation (5G) New Radio (NR) applications.

This disclosure provides technical solutions where the voltage generator can generate control signals with low CFT noise. One or more charge pumps in the voltage generator can achieve a low CFT noise. This can result in low CFT noise in control signals for RF switches. Various voltage generators are disclosed herein, including negative voltage charge pumps and positive voltage charge pumps. Charge pumps disclosed herein can generate low CFT noise for controlling RF switches while achieving desirable performance, such as a relatively fast switching time.

To reduce and/or minimize the CFT noise, the charge pump can utilize a clock scheme disclosed herein. The clock scheme may generate a plurality of clock signals, where each of the plurality of clock signals can be an input to the charge pump. In addition, the clock signals can be generated in a way that reduces and/or minimizes the CFT noise in a voltage generated by a voltage generator. For example, if a charge pump of a voltage generator includes multiple sets of switches, where each set of switches includes two switches connected in series, each individual switch in the charge pump can receive a specific clock signal. Low CFT noise can be achieved, for example, by controlling each of the switches in the charge pump with the clock signals such that only one of the two switches of a set transitions state (e.g., turns on or turns off) at a time.

A charge pump can include one or more fly capacitors, where the fly capacitor can each have its own intrinsic parasitic capacitances Such parasitic capacitances, being charged and discharged every clock cycle, can undesirably disturb the voltage generated by the charge pump. The voltage disturbance can manifest itself as a noise signal that is mixed with the actual voltage generator output signal. The voltage disturbance can be a source of CFT noise. This noise signal can be introduced in a control signal for an RF switch. In this example, the noise in the control signal can degrade the performance of the RF switch.

Fly capacitors are disclosed to reduce and/or minimize parasitic capacitance at sensitive nodes (e.g., An/Bn for negative voltage generator and Ap/Bp for positive voltage generator, as shown in, for example, FIGS. 5A, 6A, 7, 8, 9A, and 9B). Such a fly capacitor can include, for example, a P-type fly capacitor in a negative voltage charge pump or an N-type fly capacitor in a positive voltage charge pump. A P-type fly capacitor can include a P-type metal oxide semiconductor field effect transistor (PMOSFET) with source and drain nodes of the PMOSFET as a positive terminal and the gate node of the PMOSFET as a negative terminal. An N-type fly capacitor can include a N-type metal oxide semiconductor field effect transistor (NMOSFET) with a gate of the NMOSFET connected to a positive terminal of the charge pump and the source and drain connected to a negative terminal of the charge pump. Implementing a P-type fly capacitor in a negative voltage charge pump can achieve lower parasitic-capacitance-induced noise. Implementing an N-type fly capacitor in a positive voltage charge pump can achieve low parasitic-capacitance-induced noise.

A level shifter can generate one or more input signals for a charge pump. For example, a clock generation circuit may generate two clock signals, where the two clock signals are logical complements of each other. One or both of the two clock signals can be associated with at least one respective switch in the charge pump. The clock signals can be used to control the switches of the charge pump. The two clock signals can be provided to the level shifter, where the level shifter generates a level shifted version of at least one of the two clock signals. The level shifted clock signal can be used as a control signal for one or more switches in the charge pump.

However, when the level shifter utilizes the charge pump output voltage as a supply voltage, any shoot through current through the level shifter per clock cycle can disturb the charge pump output voltage. Such clock-induced disturbance (noise) at the charge pump output can propagate to the RF switch(es), which are being controlled by positive voltage generator (PVG) and negative voltage generator (NVG) signals. Shoot through current at the level shifter can drain the PVG or NVG voltage, which can manifest itself as CFT.

Level shifters disclosed herein can reduce and/or minimize the CFT noise associated with a level shifter in a clock generator. Such level shifter can use a different voltage than the charge pump output voltage for a supply voltage. For example, the level shifter can use an external power supply as a supply voltage. Such a supply voltage can be provided by a voltage regulator or power source for the charge pump. Since such a level shifter does not use an output voltage of the charge pump, it should not create a disturbance on charge pump output upon every clock cycle and hence can create little or minimal CFT to the RF switches.

Voltage generators and radio frequency systems disclosed herein can be implemented in wireless communication devices, such as mobile devices. FIG. 1 is a block diagram of one embodiment of a mobile device 100. The mobile device 100 can include one or more voltage generators in accordance with any suitable principles and advantages disclosed herein. The mobile device 100 can include RF switches arranged to pass radio frequency signals. The RF switches can include semiconductor-on-insulator transistors, such as silicon-on-insulator transistors. Voltage generators disclosed herein can be used to generate control signals for RF switches in the mobile device 100.

As illustrated in FIG. 1, the mobile device 100 can include a RF front end system 110 that can be used for wireless communication using a wide variety of communications technologies, including, but not limited to, second generation (2G), third generation (3G), fourth generation (4G)

(including Long Term Evolution (LTE), LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof. The illustrated switching module 120 can include a plurality of RF switches and a voltage generator in accordance with any suitable combination of features disclosed herein. The switching module 120 can selectively electrically connect a particular signal path to an output of a power amplifier 114. The switching module 120 can select an operating frequency of the RF front end system 110. For example, the RF front end system 110 may be operatable over a plurality of frequency bands, and a specific operation band can be selected by controlling the plurality of switches in the switching module 120. As another example, the switching module 120 can selectively electrically connect the power amplifier to different signal paths in different respective power modes.

The RF front end system 110 shown in FIG. 1 can include additional circuitry such as an antenna tuner 104, an antenna switch 106, duplexers and filters 108, a low noise amplifier 112, and a power amplifier 114. The antenna tuner 104 can be connected to an antenna 102 and performs an impedance matching between the RF front end system 110 and the antenna 102 to improve power transfer between the RF front end system 110 and the antenna 102. For example, selecting one RF signal path using the switching module 120 may change the impedance of the RF front end system 110. The antenna tuner 104, then, matches the impedance of the RF front end system 110 and the antenna 102. The antenna switch 106 can be used to selectively electrically connect the antenna 102 to one or more RF signal paths. Such RF signal paths can include at least a filter and an RF amplifier. The antenna switch 106 can be a multi-throw radio frequency switch. The antenna switch 106 can electrically connect the antenna 102 to different RF signal paths for different operating frequency bands and/or different power modes. Other RF circuit elements, such as multiplexers and filters 108, a low noise amplifier 112, and a power amplifier 114 aids in processing signals transmitted to and/or received from the antenna 102. For example, the other RF circuit elements can provide a number of functionalities, including, but not limited to, amplifying signals for transmission, amplifying received signals, filtering signals, duplexing of signals, frequency domain multiplexing of signals (for instance, diplexing or triplexing), phase shifting of signals, or any suitable combination thereof. The transceiver 116 generates RF signals for transmission and processes incoming RF signals received from the antenna 102.

The transceiver 116 generates RF signals for transmission and processes incoming RF signals received from the antenna 102 and processed by the RF front end system 110. In some instances, the mobile device 100 includes a plurality of antennas. It will be understood that various functionalities associated with the transmission and receiving of RF signals can be achieved by one or more components that are collectively represented in FIG. 1 as the transceiver 116. In one example, separate components (for instance, separate circuits or dies) can be provided for handling certain types of RF signals.

FIG. 1 is an example system that can use RF switches in selecting the operating frequency band and/or power mode of a wireless communication system. It will be understood that various types of RF front end system, antenna, and transceiver can be used and that various functionalities associated with the transmission and receiving of RF signals can be achieved by one or more components in FIG. 1 or by adding an additional circuitry based on a specific application. Furthermore, the RF switch is not limited to a RF version of a silicon-on-insulator (SOI) switch, and it can include any RF switches of an integrated circuit (IC).

Figure 2:
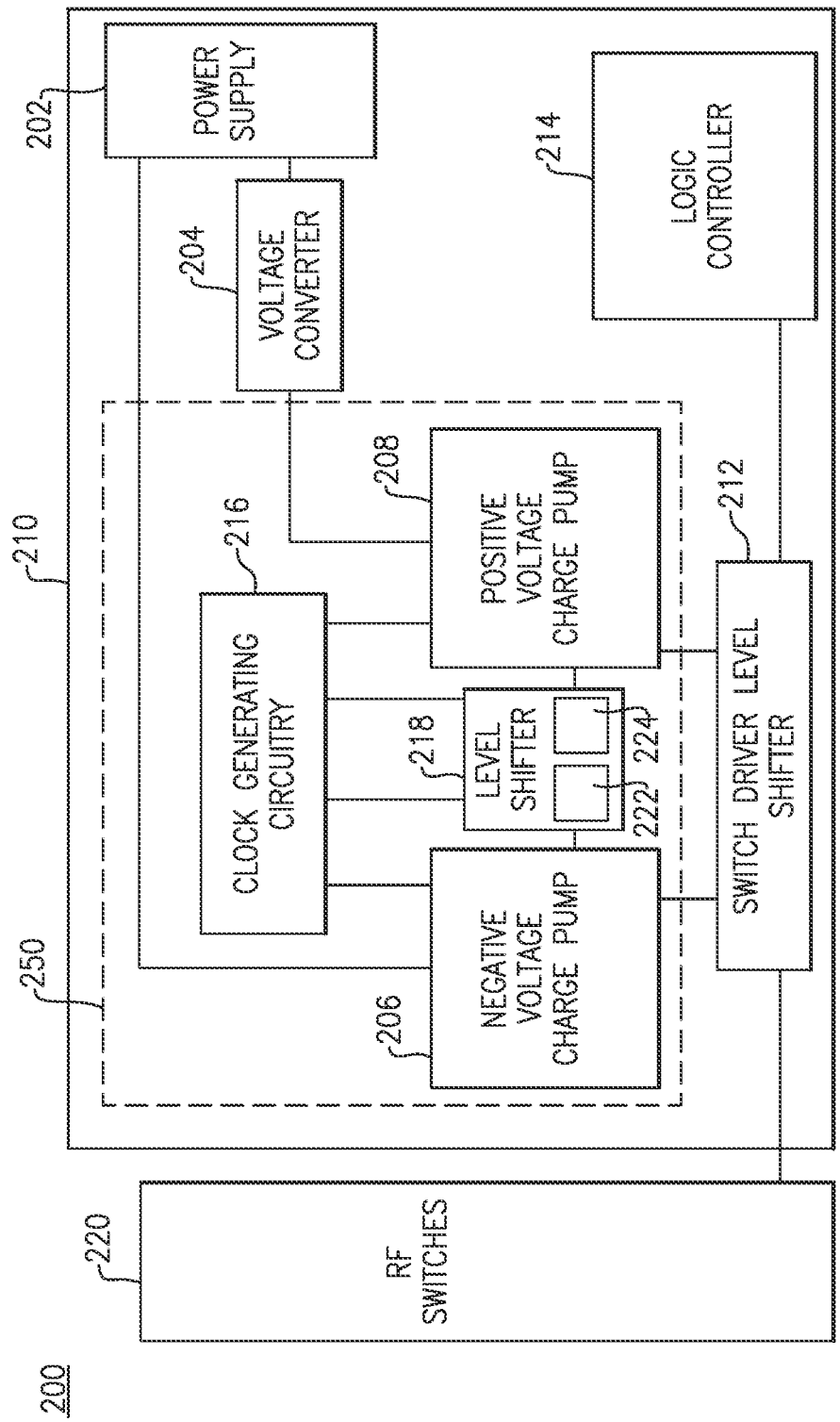
FIG. 2 is a block diagram of an example switch controlling system and related switches.

FIG. 2 is a block diagram of an example RF system 200. Illustratively, the RF system 200 can include a plurality of RF switches 220 to pass RF signals. The switch control system 210 can provide one or more control signals to the RF switches 220. The control signals can turn on or off each switch of the RF switches 220.

In certain applications, each of the RF switches 220 can be N-type switch. Such an N-type switch can be turned on by receiving a control signal having an input voltage higher than a threshold voltage (switch turn-on threshold voltage), and the switch can be turned off by receiving the input voltage lower than a threshold voltage (switch turn-off threshold voltage). The input voltage to turn on the N-type switch can be a positive voltage, and the input voltage to turn off the N-type switch can be a negative voltage.

To generate the control signals to turn on or off the RF switches 220, the switch control system 210 can include a voltage generator 250. The voltage generator 250 can include a negative voltage charge pump 206 and positive voltage charge pump 208, the clock generating circuitry 216 and a level shifter 218. The negative voltage charge pump 206 can generate a negative voltage that can be used to turn off one or more of the plurality of RF switches 220 that are N-type switches. The positive voltage charge pump 208 can generate a positive voltage that can be used to turn-on one or more of the plurality of RF switches 220 that are N-type switches. For example, the positive voltage charge pump 208 may generate a positive voltage that is higher than the threshold voltage of each of the plurality of RF switches 220, and the RF switches, by receiving the positive voltage, can be turned on. In this example, the negative voltage charge pump 206 also generates a negative voltage lower than a threshold voltage of each of the plurality of RF switches 220, and the RF switches, by receiving the negative voltage, can be turned off.

As shown in FIG. 2, the voltage generator 250 also can include the clock generating circuitry 216 and the level shifter 218. The clock generating circuitry 216 can generate clock signals for the negative voltage charge pump 206 and positive voltage charge pump 208. Furthermore, one or more of the clock signals generated by the clock generating circuitry 216 can be level shifted by the level shifter 218. The level shifter 218 can generate one or more level shifted clock signals from the one or more clock signals received from the clock generating circuitry 216. The one or more level shifted clock signals can be provided to the negative voltage charge pump 206 and/or the positive voltage charge pump 208. For example, the clock generating circuitry 216 may generate multiple clock signals to control switches in the negative voltage charge pump 206 and the positive voltage charge pump 208. In certain applications, some of the switches in the negative voltage charge pump 206 and the positive voltage charge pump 208 are controlled by the clock signals generated directly from the clock generating circuitry 216. One or more other switches in the negative voltage charge pump 206 and/or the positive voltage charge pump 208 can receive one or more level shifted clock signals from the level shifter 218.

The level shifter 218 can include two level shifters, a negative level shifter circuit 222 and a positive level shifter circuit 224. The negative level shifter circuit 222 can generate one or more level shifted clock signals for the negative voltage charge pump 206. The positive level shifter circuit 224 can generate one or more level shifted clock signals for the positive voltage charge pump 208. A negative voltage generator can include the clock generating circuitry 216, the negative voltage charge pump 206, and the negative level shifter circuit 222. The negative voltage generator can generate a negative voltage having a greater magnitude than a supply voltage. A positive voltage generator can include the clock generating circuitry 216, the positive voltage charge pump 208, and the positive level shifter circuit 224. The positive voltage generator can generate a positive voltage having a greater magnitude than a supply voltage.

The negative voltage charge pump 206 and positive voltage charge pump 208 in FIG. 2 can each receive a respective supply voltage from a power supply 202. The power supply voltage can be filtered to reduce and/or eliminate any noise. The negative voltage charge pump 206 can receive the supply voltage. In addition, a voltage converter 204 may convert the supply voltage from the power supply 202 into a desired supply voltage of the positive voltage charge pump 208.

The switch control system 210 in FIG. 2 further includes a switch driver level shifter 212. The switch driver level shifter 212 is an example of a switch driver configured to provide a control signal to an RF switch. The switch driver level shifter 212 can receive a negative voltage from the negative voltage charge pump 206 and a positive voltage from the positive voltage charge pump 208. The switch driver level shifter 212 can provide one or more control signals to the RF switches 220 based on signals received from a logic controller 214. The switch driver level shifter 212 can level shift the positive voltage and/or the negative voltage to generate the one or more control signals. The logic controller 214 may provide signals to determine which switch(es) to the RF switches 220 to turn on and to turn off.

FIG. 2 is provided as an example RF system where RF switches are controlled based on generating voltage as an input to the switches and controlling the switching operation based on logic. It will be understood that various functionalities associated with the controlling switches can be achieved by one or more components in FIG. 2 or by adding an additional circuit based on a specific application. Furthermore, one or more circuits in FIG. 2 can be integrated as an application-specific integrated circuit (ASIC).

Figure 3:
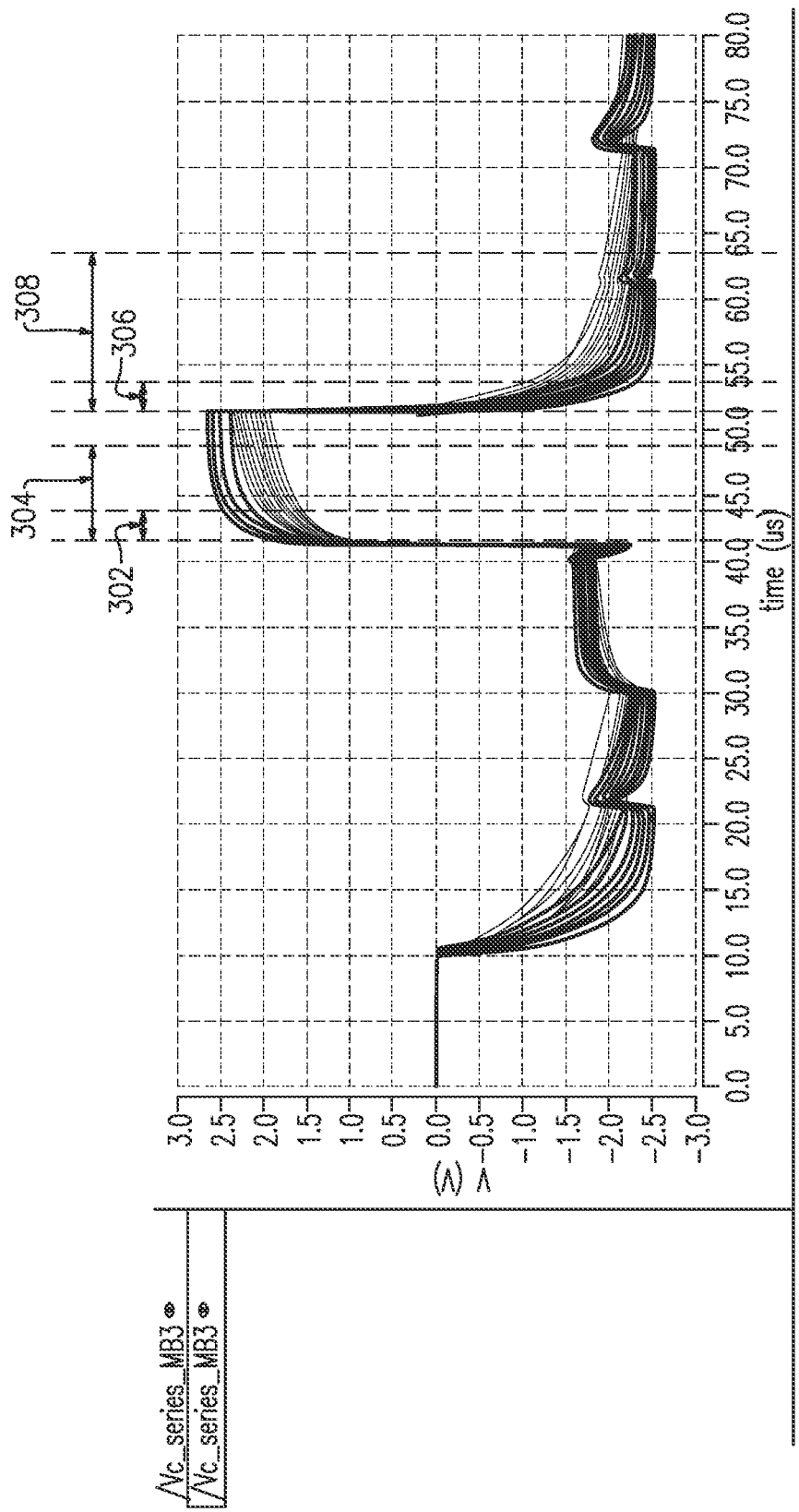
FIG. 3 is a graph showing the switching time of RF switches by implementing certain filtering of control signals for the RF switches.

FIG. 3 is a graph illustrating an example of the switching time of RF switch with and without implementing a filter between the RF switches 220 of FIG. 2 and the switch driver level shifter 212 of FIG. 2. The voltage generator 250 of FIG. 2 can introduce a clock feed through (CFT) signal that can propagate to the RF switches 220.

One approach to reduce and/or minimize CFT is to implement a filter between the RF switches 220 and the switch control system 210. The filter can be used to filter out the noise signal to reduce and/or minimize the noise signal propagation into the RF switches 220. However, implementing such a filter can cause a slower switching time for one or more of the RF switches 220. As shown in FIG. 3, for example, the turn-on time 304 for a system that includes such a filter is longer than the switching time 302 for a system that does not implement the filter. Furthermore, the turn-off time 308 for a system with the filter is longer than the turn-off time 306 for a system without the filter. The slower switching of the RF switch is a performance degradation. Such performance degradation can be significant, for example, in an RF front end system with a fast switching, such as in 5G NR applications.

Figure 4B:
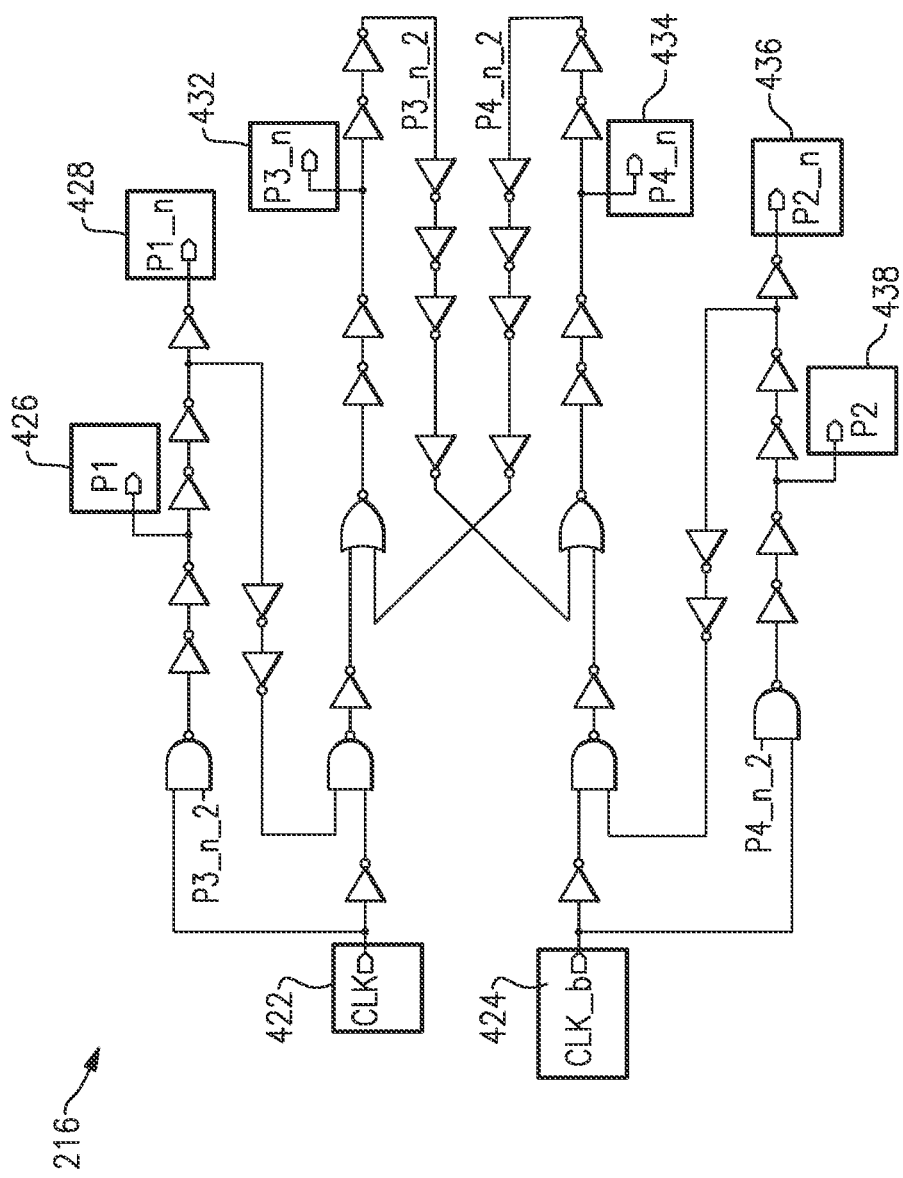
FIG. 4B is a schematic diagram of an example of a clock generation circuit of FIG. 2 that generates charge pump control clock signals.

FIGS. 4A and 4B show an example clock signal waveform and clock generation circuitry. The clock signal waveform can be utilized as input signal for one or more of the charge pumps to generate voltages. The generated voltages can be used for controlling RF switches. The clock signal waveform of FIG. 4A can be generated using the clock generation circuitry of FIG. 4B. The waveform 410 can represent the clock signals during the first phase, and the waveform 420 can represent the clock signals during the second phase.

FIG. 4A is an example of charge pump input clock signal waveform 400 according to an embodiment. To reduce and/or minimize the CFT noise generated from a charge pump of a voltage generator, each switch implemented in the charge pumps (e.g., the negative voltage charge pump 206 and positive voltage charge pump 208 of FIG. 2) can be controlled by generating a particular clock signal for each of the switches. As shown in FIG. 4A, various clock signals (e.g., first clock signal P1, second clock signal P2, third clock signal P3, and fourth clock signal clock signal P4), can be generated. The clock signals may include first phase clock signals and second phase clock signals. The first phase clock signals of waveform 410 and second phase clock signals of waveform 420 can be used to charge or discharge a specific fly capacitor in the charge pumps and to provide a desired output voltage. Furthermore, each of the clock signals can be such that relatively low CFT noise is achieved. For example, the clock signals can be specifically generated, such that nearby switches in the charge pump (e.g., a set of switches or two switches connected in series) toggle state (e.g., turn on or off) at different times.

FIG. 4B is a schematic diagram of an example of the clock generating circuitry 216 that generates charge pump control clock signals. As shown in FIG. 4B, the clock generating circuitry 216 can include first and second input nodes 422, 424. One or more clock signals can be supplied to the input nodes 422, 424 as an input signal of the clock generating circuitry 216. Output clock signals can be generated from the input signal(s) based on one or more logic gates. The logic gates are arranged to generate the output clock signals. For example, the clock signal supplied to the first input node 422 can be used to generate the first clock signal P1 at output node 426 and the inverse first clock signal P1_n at output node 428 that is the logical complement of the first clock signal P1. The logic gates can use the clock signal supplied to the second input node 424 to generate the second clock signal P2 at output node 438 and the inverse second clock signal P2_n at output node 436. The logic gates can use the input signals supplied to the first and second input nodes 422, 424 to generate the inverse third clock signal P3_n at output node 432 and the inverse fourth node clock signal P4_n at output node 434. The clock signal waveforms and schematic diagrams shown in FIGS. 4A and 4B are merely provided as an example, and specific types of clock signals and/or schematic diagrams can be used based on a specific application. Furthermore, the number of input nodes and the logic gates used in the clock generating circuitry 216 can be modified based on a specific application.

Figure 5A:
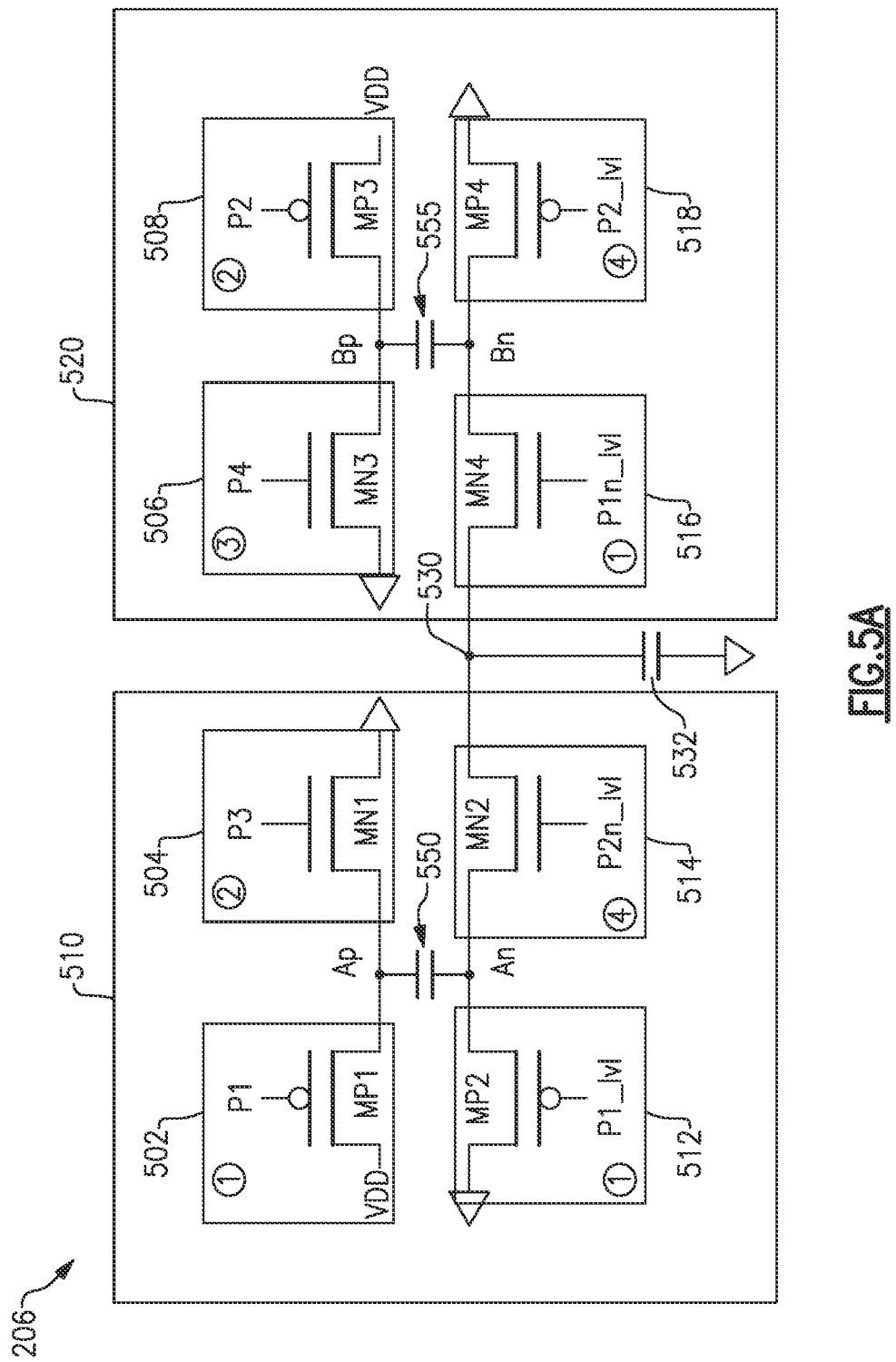
FIG. 5A is a schematic diagram of an example negative voltage charge pump according to an embodiment.
Figure 5C:
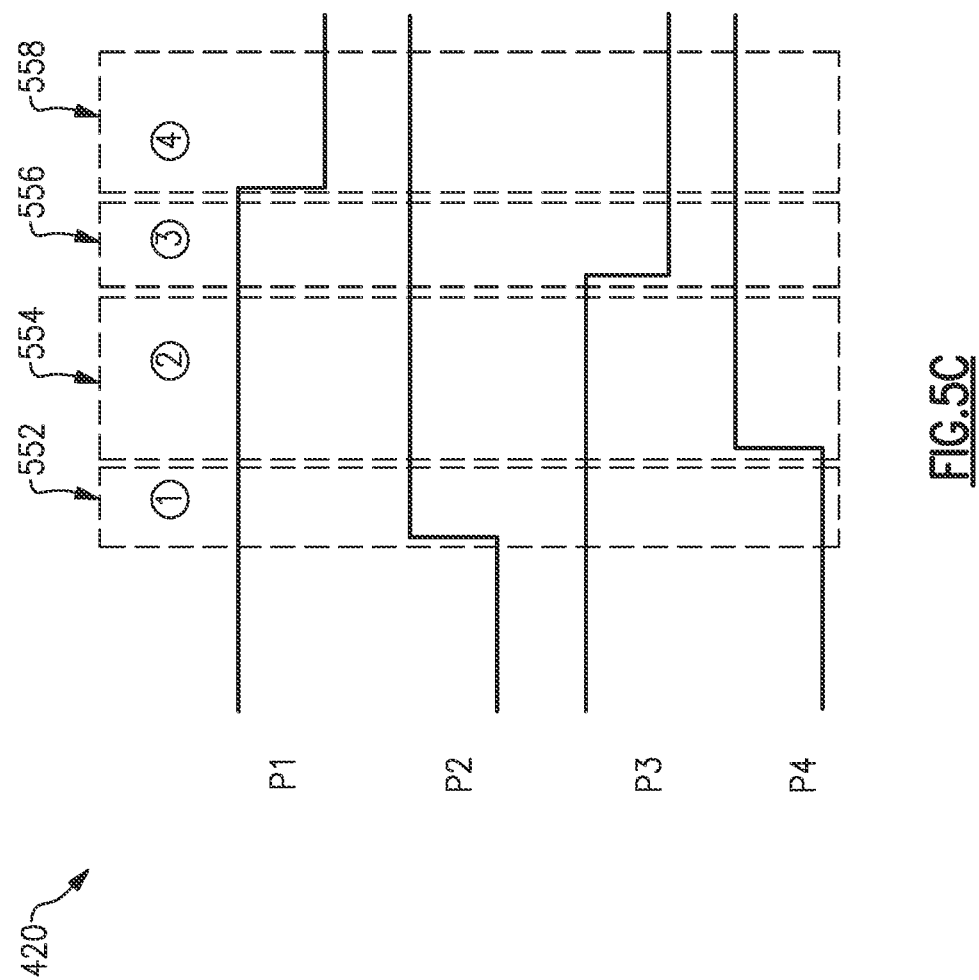
FIG. 5C illustrates examples of clock signals for controlling the negative voltage charge pump during second phase.

FIG. 5A is a schematic diagram of an example of the negative voltage charge pump 206 arranged to generate a negative voltage with a low clock feedthrough (CFT). The negative voltage charge pump 206 shown in FIG. 5A is an example of the negative voltage charge pump of FIG. 2. FIGS. 5B and 5C show waveforms of clock signals for the negative voltage charge pump 206 in different phases. In these examples, the negative voltage charge pump 206 includes multiple sets of switches, where each set of switches includes a N-type switch and a P-type switch. The switches in the negative voltage charge pump 206 can utilize the clock signals having the waveform 400 of FIG. 4A generated by the clock generating circuitry 216 of FIG. 4B. In addition, one or more clock signals can be shifted by using the level shifter 218 of FIG. 2 to generate one or more level shifted clock signals. Such level shifted clock signals can used to control one or more switches in the negative voltage charge pump 206.

FIG. 5A is a schematic diagram of an example negative voltage charge pump 206 according to an embodiment. The negative voltage charge pump 206 is a charge pump configured to generate a negative voltage output. The negative voltage charge pump 206 can have receive a positive voltage and generate a negative voltage. As one example, the negative voltage charge pump 206 can receive a +2.5 Volt input and generate a −2.4 Volt output.

The negative voltage charge pump 206 may include a first part 510 and a second part 520, where the first part 510 and part 520 are both connected at an output node 530. The negative voltage charge pump 206 is configured to generate a negative voltage. The negative voltage can be used to toggle the state of an RF switch (e.g., turn off an RF switch), such as an RF switch of the RF switches 220 (shown in FIG. 2). Each part of the negative voltage charge pump 206 can include a first set of two switches arranged between a supply voltage and a ground and a second set of two switches arranged between the output node 530 and ground. For example, the first part 510 includes the first set of two switches 502, 504 are arranged between the power supply voltage VDD and ground. As illustrated, first part 510 also includes a second set of switches 512, 514 arranged between the output node 530 and ground. The second part 520 also includes two sets of switches, including a first set of switches 506, 508 and a second set of switches 516, 518.

In the illustrated negative voltage charge pump 206, a first set of switches 502, 504 arranged between power supply and ground and a second set of switches 512, 514 arranged between output node 530 and ground are both connected to a fly capacitor 550. Similarly, a first set of switches 506, 508 and a second set of switches 516, 518 are connected to a fly capacitor 555. Each set of the switches can include a N-type transistor and a P-type transistor.

Each switch in the negative voltage charge pump of FIG. 5A can receive one of the clock signals generated by clock generating circuitry 216 or a level shifted version of one of the clock signals. For example, in the first part 510, a switch 502 can receive a first clock signal P1 and a switch 504 can receive a third clock signal P3. The first clock signal P1 generated by the clock generating circuitry 216 can be level shifted by a level shifter, such as the level shifter 218 of FIG. 2, to generate a first shifted clock signal P1_1v1. The inverse second clock signal P2n can be input to the level shifter to generate an inverse second level shifted clock signal P2n_1v1. The first level shifted clock signal P1_1v1 and the inverse second level shifted clock signal P2n_1v1 can be provided as controls signals to the switch 512 and switch 514, respectively. Similarly, each switch in the second part 520 can receive a clock signal either generated by the clock generating circuitry 216 or a level shifted clock signal from the level shifter. For example, a switch 506 can receive the fourth clock signal P4 and a switch 508 can receive the second clock signal P2. The inverse first clock signal P1n can be level shifted by a level shifter to generate an inverse first level shifted clock signal, P1n_1v1. Also, the second clock signal P2 can be level shifted by the level shifter to generate the second level shifted clock signal P2_1v1. The inverse first and second level shifted clock signals P1_1v1, P2n_1v1 can be provided to a control terminal of the switch 516 and switch 518, respectively.

As shown in FIG. 5A, the negative voltage charge pump 206 can include a fly capacitor 550 in the first part 510, and a fly capacitor 555 in the second part 520. The fly capacitors 550 and 555 can be charged or discharged based on input clock signals to the switches to generate a desired output voltage at the output node 530. A load capacitor 532 also can be selected based on output voltage specification and to reduce and/or minimize noise generated at the output node 530.

FIG. 5B illustrates a waveform of the example of clock signals for controlling the negative voltage charge pump 206 during the first phase. During the first phase, the switches 504, 514, 508, 518 are turned on, and the switches 502, 512, 506, 516 are turned off. Advantageously, by utilizing the clock signals of the waveform 410, as shown in FIG. 5B, a relatively low CFT noise can be achieved. For example, utilizing the clock signals of the waveform 410, only one switch of a set of switches can toggle state at a time. This can block current flow between the switches of the set of switches (e.g., between switches 502 and 504; switches 514 and 512; switches 508 and 506; and switches 516 and 518) and also between switches 504 and 514 and switches 506 and 516. In this example, individual switches in the set of switches (e.g. switches 502 and 504, switches 512 and 514, switches 506 and 508, switches 516 and 518) do not transition state concurrently, such that one of the switches in the set of switches is only turned on or off (i.e., transitions state) when another switch in the set of switch is not transitioning state. One switch of a set of an N-type switch and a P-type switch can be turned on while the other switch of the set is off.

For example, during a first time period 542 of the first phase, the switches 502, 512, and 516 can be turned off to transition state from being on. During a second time period 544 of the first phase, the switch 504 can be turned on to transition state relative to in the first time period 542. During a third time period 546 of the first phase, the switch 506 can be turned off to transition state. During a fourth time period 548 of the first phase, the switches 508, 518, and 514 can be turned on to transition state. Using the clock signals of the waveform 410 for the first phase, N-type and P-type switches in series with each other (1) transition state at different times and (2) are not on concurrently. As illustrated in FIG. 5B, during each time period 542, 544, 546, and 548, only one of the four clock signals transition during the corresponding time period. For example, during each time period 542, 544, 546, or 548, one respective clock signal P1, P3, P4, or P2 transitions state.

FIG. 5C illustrates a waveform 420 of example of clock signals for controlling the negative voltage charge pump 206 during a second phase. During the second phase, the switches 502, 512, 506, 516 are turned on, and the switches 504, 514, 508, 518 are turned off. Advantageously, by utilizing the clock signals of the waveform 420 shown in FIG. 5B, relatively low CFT noise can be achieved. During a first time period 552 of the second phase, the switches 508, 518, and 514 can be turned off. During a second time period 554 of the second phase, the switch 506 can be turned on. During a third time period 556 of the second phase, the switch 504 can be turned off. During a fourth time period 558 of the second phase, the switches 502, 512, and 516 can be turned on. Using the clock signals of the waveform 420 for the second phase, N-type and P-type switches in series with each other (1) transition state at different times and (2) are not on concurrently. As illustrated in FIG. 5C, during each time period 552, 554, 556, and 558, only one of the four clock signals transitions. For example, during each time period 552, 554, 556, or 558, on respective clock signal P2, P4, P3, or P1 transitions state.

Figure 6A:
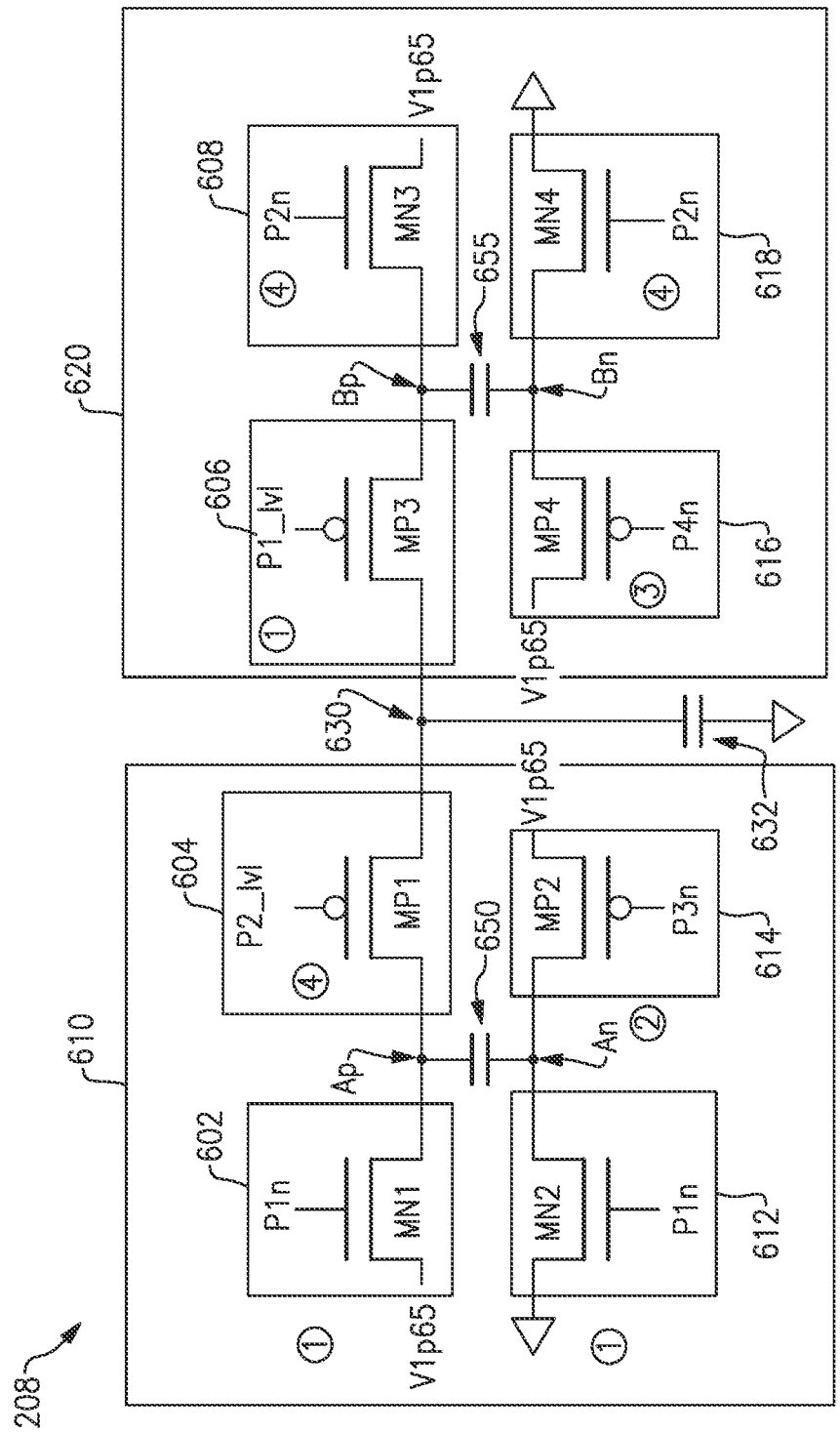
FIG. 6A is a schematic diagram of an example positive voltage charge pump charge pump.

FIG. 6A is a schematic diagram of an example of the positive voltage charge pump 208 of FIG. 2 to generate a positive voltage with a low clock feedthrough (CFT). The positive voltage charge pump 208 can receive a positive voltage and generate a positive voltage having a larger magnitude that the received positive voltage. In some instances, the positive voltage charge pump 208 can generate a positive output voltage having about 2 times the magnitude of the input voltage. As one example, the positive voltage charge pump 208 can receive a +1.65 Volt input and generate a +3.3 Volt output. In FIG. 6A, the positive voltage charge pump 208 includes multiple sets of switches, where each set of switches include a N-type switch and a P-type switch in series with each other. The positive voltage charge pump 208 can utilize the clock signals of the waveforms FIGS. 6B and 6C generated by the clock generating circuitry 216 of FIG. 4B and/or level shifted clock signal generated by a level shifter.

FIG. 6A is a schematic diagram of an example positive voltage charge pump 208 according to an embodiment. The positive voltage charge pump 208 is a charge pump configured to generate a positive voltage output having a higher magnitude than an input voltage. The positive voltage charge pump 208 includes sets of switches that include a N-type transistor and a P-type transistor and are connected to a fly capacitor. As one example, the positive voltage charge pump 208 can receive a +1.65 Volt input and generate a 3.3 Volt output. The 1.65 Volt supply voltage can be generated, for example, by the voltage converter 204 of FIG. 2. The output voltage from the positive voltage charge pump 208 can be used to control an RF switch, such as an SOI RF switch.

As illustrated, the positive voltage charge pump 208 includes a first part 610 and a second part 620. The first part 610 includes a first set of switches 602, 604 arranged between a supply voltage and an output node 630 and a second set of switches 612, 614 arranged between the supply voltage and the ground. These two sets of switches are connected to a fly capacitor 650. The sets of switches and charge and discharge the fly capacitor 650. The second part 620 includes a first set of switches 606, 608 arranged between a supply voltage and an output node 630 and a second set of switches 616, 618 arranged between the supply voltage and the ground. These two sets of switches are connected to a fly capacitor 655. The sets of switches and charge and discharge the fly capacitor 655.

Each switch of the positive voltage charge pump 208 can receive one of the clock signals of the waveform 400 of FIG. 4A and/or generated by the clock generating circuitry 216 of FIGS. 2 and/or 4B or a level shifted version of a clock signal from the clock generating circuitry 216.

As shown in FIG. 6A, the positive voltage charge pump 208 can further include a fly capacitor 650 in the first part 610 and a fly capacitor 655 in the second part 620. The fly capacitors 650 and 655 can be charged or discharged based on input clock signals to the switches to generate a desired output voltage at the output node 630. A load capacitor 632 also can have a capacitance selected to reduce and/or minimize noise generated at the output node 630.

FIG. 6B illustrates an example waveform 410 of clock signals for controlling the positive voltage charge pump 208 during a first phase. During the first phase, the switches 604, 614, 608, 618 are turned on and the switches 602, 612, 606, 616 are turned off. Advantageously, by utilizing the clock signals of the waveform 410, relatively low CFT noise can be achieved. For example, utilizing these clock signals, current flow can be blocked between each set of N-type and P-type switches (e.g., between switches 602 and 604; between switches 614 and 612; between switches 608 and 606; and between switches 616 and 618) and also between set of P-type switches 604 and 614 and switches 606 and 616. During a first time period 642 of the first phase, the switches 602, 612, and 606 can be turned off. During a second time period 644 of the first phase, the switch 614 can be turned on. During a third time period 646 of the first phase, the switch 616 can be turned off. During a fourth time period 648 of the first phase, the switches 608, 618, and 604 can be turned on. With these switching times, relatively low CFT noise can be achieved.

Figure 6C:
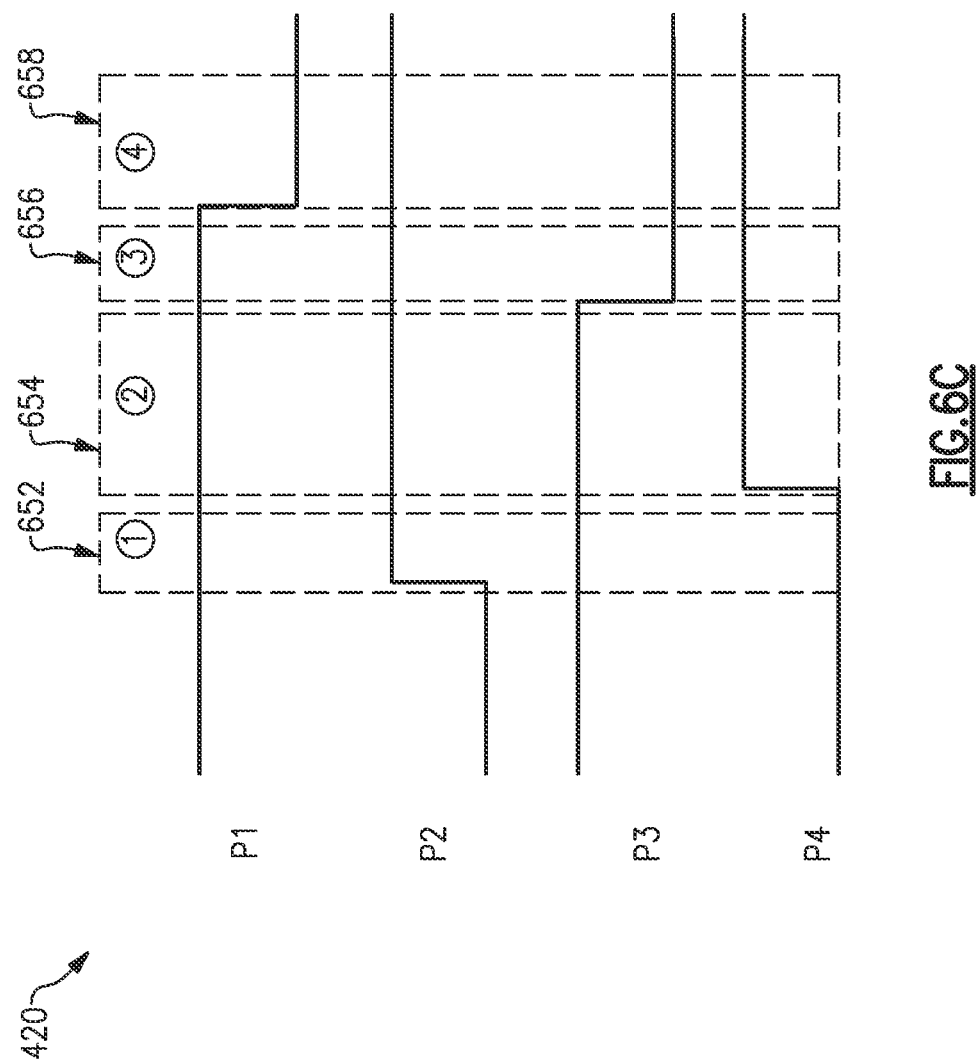
FIG. 6C illustrates examples of clock signals for controlling the positive voltage charge pump charge pump during second phase.

FIG. 6C illustrates an example waveform 420 of clock signals for controlling the positive voltage charge pump 208 during a second phase. During the second phase, the switches 602, 612, 606, 616 are turned on and the switches 604, 614, 608, 618 are turned off. Advantageously, by utilizing the clock signals of the waveform 420, relatively low CFT noise can be achieved. For example, utilizing these clock signals, current flow can be blocked between the sets of switches that includes an N-type switch is series with a P-type switch (e.g., between switches 602 and 604; between switches 614 and 612; between switches 608 and 606; and between switches 616 and 618) and also between switches P-type switches 604 and 614 and P-type switches 606 and 616. In this example, switches in each set that includes a N-type switch in series with a P-type switch transition at different times. During a first time period 652 of the second phase, the switches 608, 618, and 616 can be turned off. During a second time period 554 of the second phase, the switch 616 can be turned on. During a third time period 556 of the second phase, the switch 614 can be turned off. During a fourth time period 558 of the second phase, the switches 602, 612, and 606 can be turned on.

Figure 7:
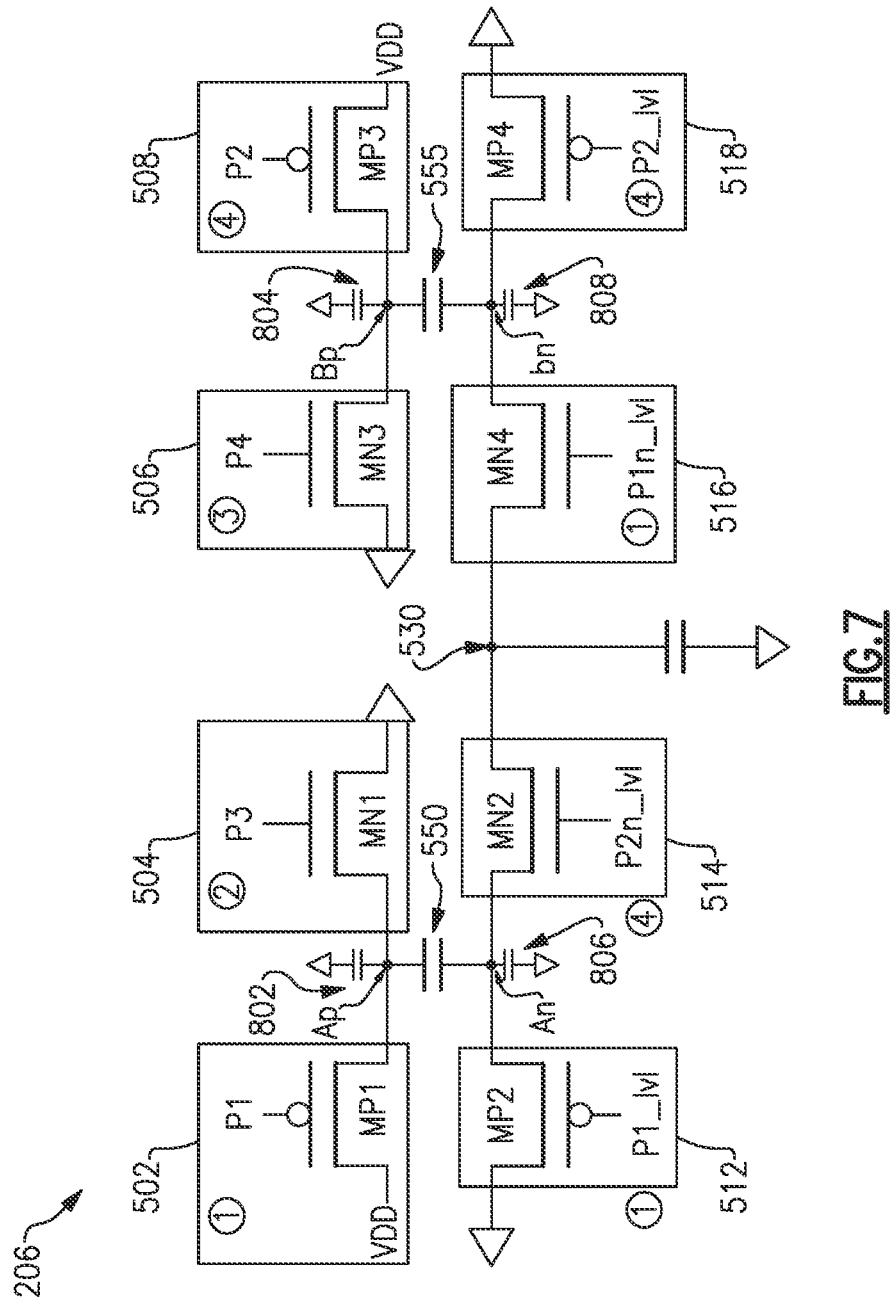
FIG. 7 is a schematic diagram of an example negative voltage charge pump with parasitic capacitance associated with fly capacitors illustrated.

FIG. 7 is a schematic diagram of an example negative voltage charge pump with parasitic capacitance associated with fly capacitor illustrated. Typically, the fly capacitors 550 and 555 are used to store charge, where the charge can be used to raise or lower output voltage. For example, the fly capacitors 550 and 555 can be charged or discharged based on the operation of the switches in the negative voltage charge pump 206 to generate the desired output voltage. However, parasitic capacitance can be introduced due to the presence of the fly capacitors 550 and 555. For example, as shown in FIG. 5A, the negative voltage charge pump 206 can have parasitic capacitances 802, 804, 806, 808 due to the fly capacitors 550 and 555. These parasitic capacitances can cause performance degradation. For example, a noise signal can be generated due to the parasitic capacitance, and the noise signal can affect the output voltage generated at the output node 530. The parasitic capacitances 806, 808 can have a higher impact on noise generation than the parasitic capacitances 802, 804. To reduce these parasitic capacitances 806 and 808, P-type metal-oxide-semiconductor (PMOS) transistors can be used to implement a fly capacitor in the negative voltage charge pump 206.

Figure 8:
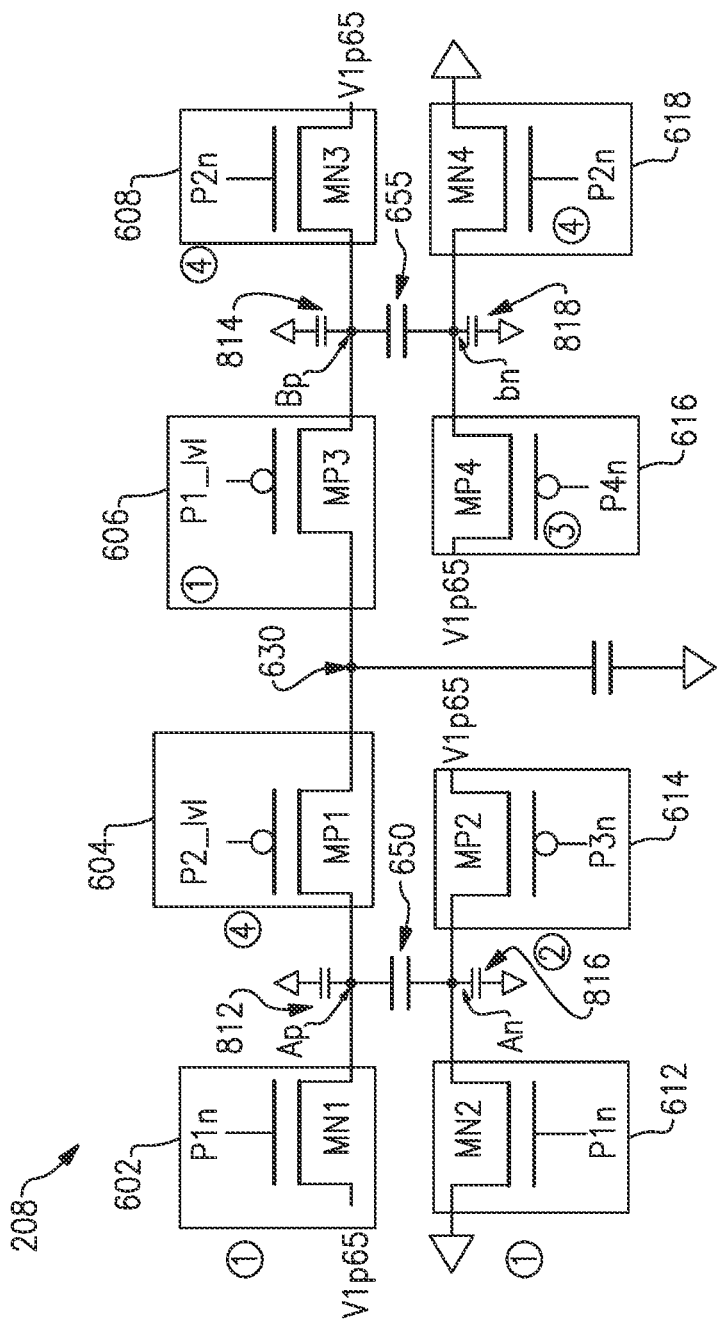
FIG. 8 is a schematic diagram of an example positive voltage charge pump with parasitic capacitance associated with fly capacitors illustrated.

FIG. 8 is a schematic diagram of an example positive voltage charge pump 208 with parasitic capacitance associated with fly capacitors illustrated. As shown in FIG. 8, the positive voltage charge pump 208 can introduce parasitic capacitances 812, 814, 816, 818 due to the fly capacitors 650 and 655. These parasitic capacitances can cause performance degradation. For example, a noise signal can be generated due to the parasitic capacitance, and the noise signal can affect the output signal generated at the output node 630. The parasitic capacitances 812, 814 can have a higher impact on noise generation than the parasitic capacitances 816, 818. Accordingly, the parasitic capacitances 812, 814 can cause more performance degradation than the parasitic capacitances 816, 818. To reduce these parasitic effects, N-type metal-oxide-semiconductor (NMOS) transistors can be used to implement a fly capacitor in the positive voltage charge pump 208.

Figures 9A, 9B:
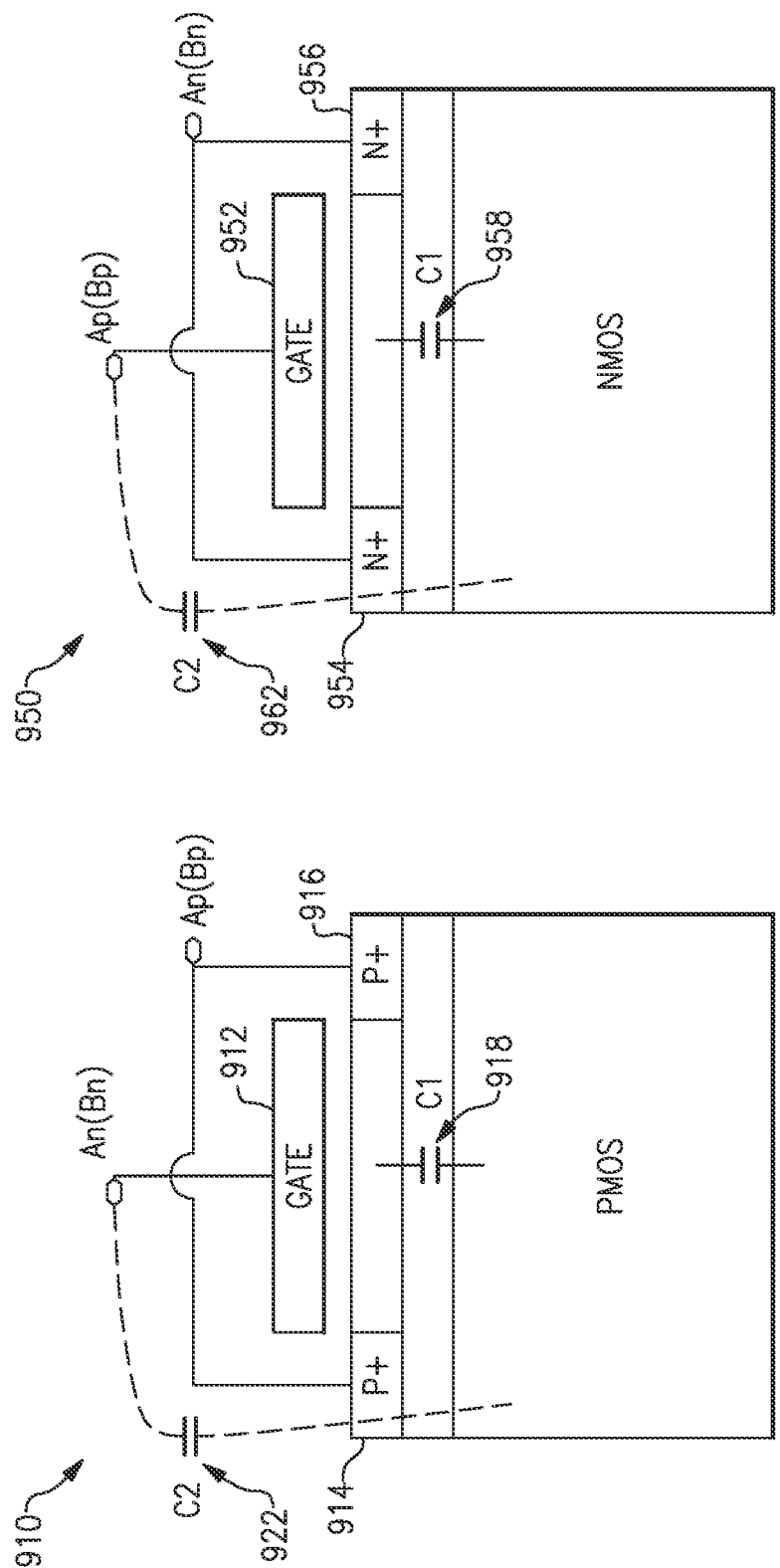
FIG. 9A is a diagram of an example P-type metal-oxide-semiconductor (PMOS) transistor arranged as a fly capacitor for a negative voltage charge pump.
FIG. 9B is a diagram of an example N-type metal-oxide-semiconductor (NMOS) transistor arranged as a fly capacitor for a positive voltage charge pump.

FIGS. 9A and 9B are schematic diagrams of example fly capacitors for charge pumps in voltage generators. FIG. 9A illustrates a P-type metal-oxide-semiconductor (PMOS) fly capacitor 910. FIG. 9B illustrates an N-type metal-oxide-semiconductor (NMOS) fly capacitor 950. These fly capacitors can be implemented in charge pumps disclosed herein.

FIG. 9A is a schematic diagram of an example PMOS fly capacitor 910. The PMOS fly capacitor 910 can be used in a negative voltage charge pump 206. Utilizing the PMOS as a fly capacitor in the negative voltage charge pump 206 can be advantageous because the PMOS fly capacitor 910 can provide a reduced parasitic effect to the output node 530 of the negative voltage charge pump 206.

As shown in FIG. 9A, the PMOS fly capacitor 910 can include a first parasitic capacitance 922 associated with a gate 912 or negative terminal An(Bn). The PMOS fly capacitor 910 can also include a second parasitic capacitance 918 associated with a channel or positive terminal Ap(Bp). The first parasitic capacitance 918 can be larger than the second parasitic capacitance 922. Thus, to reduce the parasitic effect, the negative terminal An/Bn can have lower parasitic capacitance because the negative An/Bn is connected to the output node 530 of the negative voltage charge pump 206 through an N-type switch 514 or 516. Thus, the output node 530 of the negative voltage charge pump can have a lower parasitic capacitance by connecting the gate 912 to the negative terminal An(Bn) of the fly capacitor 910. However, if NMOS is used as a fly capacitor in the negative voltage charge pump 206, the negative terminal An of the NMOS would be connected on the output node side such that the output node 530 would have higher parasitic capacitance.

In the PMOS fly capacitor 910, a gate 912 can be a negative terminal An/Bn. The PMOS fly capacitor 910 can be connected to the output node 530 by way of an N-type switch 514 or 516 of the negative voltage charge pump 206. Drain and source nodes 914, 916 of the PMOS fly capacitor 910 can be a positive terminal Ap/Bp that is connected to a node between the power supply voltage of the negative voltage charge pump 206 and ground. Thus, the second parasitic capacitance 918 of the PMOS fly capacitor 910 can be on the input side instead of the output side to reduce parasitic capacitance at the output node 530.

FIG. 9B is a schematic diagram of an example NMOS fly capacitor 950 that can be used in a positive voltage charge pump 208 of FIG. 2, FIG. 7, and/or FIG. 8. A gate 952 of the NMOS fly capacitor 950 can be arranged as a positive terminal Ap/Bp. The drain and source nodes 954, 956 of the NMOS fly capacitor 950 are connected to each other and arranged as a negative terminal An/Bn as illustrated. Utilizing the NMOS as the fly capacitor in the positive voltage charge pump 208 can be advantageous because the NMOS fly capacitor 950 can provide a reduced parasitic effect to the output node 630 of the positive voltage charge pump 208. A first parasitic capacitance 958 associated with the negative terminal An(Bn) can have a larger parasitic capacitance that a second parasitic capacitance 962 associated with the positive terminal Ap(Bp). Thus, the output node 630 of the positive voltage charge pump 208 can have a lower parasitic capacitance by connecting the gate 952 to the output side of the positive voltage charge pump 208. The NMOS fly capacitor 950 can be connected to the output node 630 by way of a PMOS switch 604 or 606. Using an NMOS device for a fly capacitor for the positive voltage charge pump 208 can reduce parasitic capacitance on the output node 630 relative to using a PMOS device as a fly capacitor.

The level shifter 218 of FIG. 2 can generate level shifted clock signals from received clock signals. For example, the level shifter 218 can generate 3.3 Volt output clock signal from a received 1.65 Volt clock signal. Accordingly, the level shifter 218 can be a voltage doubler. A level shifter can be implemented in the voltage generator 250 of FIG. 2 to generate level shifted clock signals to control one or more switches in the negative voltage charge pump 206 and/or the positive voltage charge pump 208.

As one example, a level shifted clock signal can be provided to a control signal of each of the switches 512, 514, 516, 518 of FIG. 5A to turn these switches on or off. A negative voltage for the switches 512, 514, 516, 518 can be desired related to other switches 502, 504, 506, 508. In this example, the clock signals generated from the clock generating circuitry 216 of FIG. 2 are level shifted before being provided to the switches 512, 514, 516, 518.

The positive voltage charge pump 208 can utilize one or more level shifted clock signals to turn on or off one or more switches. As one example, the switches 604 and 606 of FIG. 6A can be turned on and off based on level shifted clock signals. In the positive voltage charge pump 208, a level shifted clock signal with higher magnitude can be provided to the switches 604 and 606 and clock signals with lower magnitude can be provided to other switches, such as switches 602, 606, 608, 612, 614, 616, and 618 of FIG. 6A. In this example, the clock signals generated from the clock generating circuitry 216 of FIG. 2 are level shifted to the voltage level that can turn on or off the switches 604 and 606. The second clock signal P2 and the first clock signal P1 shown in FIG. 4B can be level shifted to the second level shifted clock signal P2_1v1 and the first level shifted clock signal P1_1v1 to turn on or off the switches 604, 606, respectively.

A level shifter can use a cross-coupled type configuration coupled with complementary metal-oxide-semiconductor (CMOS) switches to generate a level shifted voltage. In such a configuration, the cross-coupled type configuration can include two PMOS transistors, where each drain of PMOS transistor is connected with a switch. This level shifter can utilize the output of a positive voltage charge pump as a power supply voltage. For example, this power supply voltage can be received from the output node 630 of the positive voltage charge pump 208 of FIG. 6A. Utilizing the output of the positive voltage charge pump as a power supply, however, may cause undesirable effects due to the shoot through current between the output node 630 of the positive voltage charge pump 208 and the ground through the level-shifter. The shoot through current may generate a noise signal, which can propagate to the RF switches 220 of FIG. 2.

FIG. 10A is a schematic diagram of an example positive level shifter 1000 according to an embodiment. The positive level shifter 1000 is an example of the positive level shifter circuit 224 of FIG. 2. The positive level shifter 1000 can be used to generate level shifted voltage for a positive voltage charge pump. As shown in FIG. 10A, the positive level shifter 1000 includes cross coupled n-type field effect transistors 1002, 1004. The n-type field effect transistors 1002, 1004 can be NMOS transistors. Each gate 1006, 1008 of a respective n-type field effect transistor is coupled with each source 1022, 1024 of another n-type field effect transistor. For example, gate 1006 of the n-type field effect transistor 1002 is connected with the source 1024 of the n-type field effect transistor 1004. In addition, gate 1008 of n-type field effect transistor 1004 is connected with the source 1022 of the n-type field effect transistor 1002.

Each source 1022, 1024 of the n-type field effect transistors are configured to receive an input signal through the input nodes 1010, 1012. The input signal can be the clock signals generated from the clock generating circuitry 216 of FIGS. 2 and/or 4B. A capacitor 1014 can be coupled between source 1022, 1024 of each NMOS transistor and input nodes 1010, 1012. The output node 1016 is configured to generate the level shifted voltage. This level shifted voltage can be used as a level shifted clock signal to turn on or off one or more switches in the positive voltage charge pump 208. In one example, the first clock signal P1 and the inverse first clock signal P1_n of FIG. 4B are supplied as input signals to the input nodes 1010, 1012, respectively. In this example, the output node 1016 can provide the first level shifted clock signal P1_1v1.

The positive level shifter 1000 can receive a supply voltage from an external power source. The external power source can be the voltage converter 204 of FIG. 2. A respective drain of each of the n-type field effect transistors 1002, 1004 can be connected to a power supply node 1020, where the power supply node 1020 receives the power from an external power source. By receiving a power supply voltage from an external power source, the positive level shifter 1000 should not drain current from the positive voltage charge pump 208 per clock cycle FIG. 10B is a schematic diagram of an example negative level shifter 1050 according to an embodiment. The negative level shifter 1050 is an example of the negative level shifter circuit 222 of FIG. 2. The negative level shifter 1050 can be used to generate level shifted clock signal for the negative voltage charge pump 206. As shown in FIG. 10B, the negative level shifter 1050 includes cross coupled p-type field effect transistors 1052, 1054. The p-type field effect transistors 1052, 1054 can be PMOS transistors. Each gate 1056, 1058 of a respective p-type field effect transistor is coupled with a source 1060, 1062 of another p-type field effect transistor 1052, 1054. For example, gate 1056 of the p-type field effect transistor 1052 is connected with the source 1062 of the p-type field effect transistor 1054. In addition, gate 1058 of p-type field effect transistor 1054 is connected with the source 1060 of the p-type field effect transistor 1052.

Each source 1060, 1062 of the p-type field effect transistors 1052, 1054 is configured to receive an input signal through the input nodes 1064, 1066. The input signal can be a clock signal generated from the clock generating circuitry 216 of FIGS. 2 and/or 4A. A capacitor 1068 can be coupled between source 1060, 1062 of each p-type field effect transistor and a respective input node 1064, 1066. The output node 1070 is configured to provide a level shifted voltage to turn on or off one or more switches of the negative voltage charge pump 206. In one example, the first clock signal P1 and the inverse first clock signal P1_n of FIG. 4B are supplied as input signals to the input nodes 1064, 1066, respectively. In this example, the output node 1070 can provide the first level shifted clock signal P1_1v1.

Figure 11A:
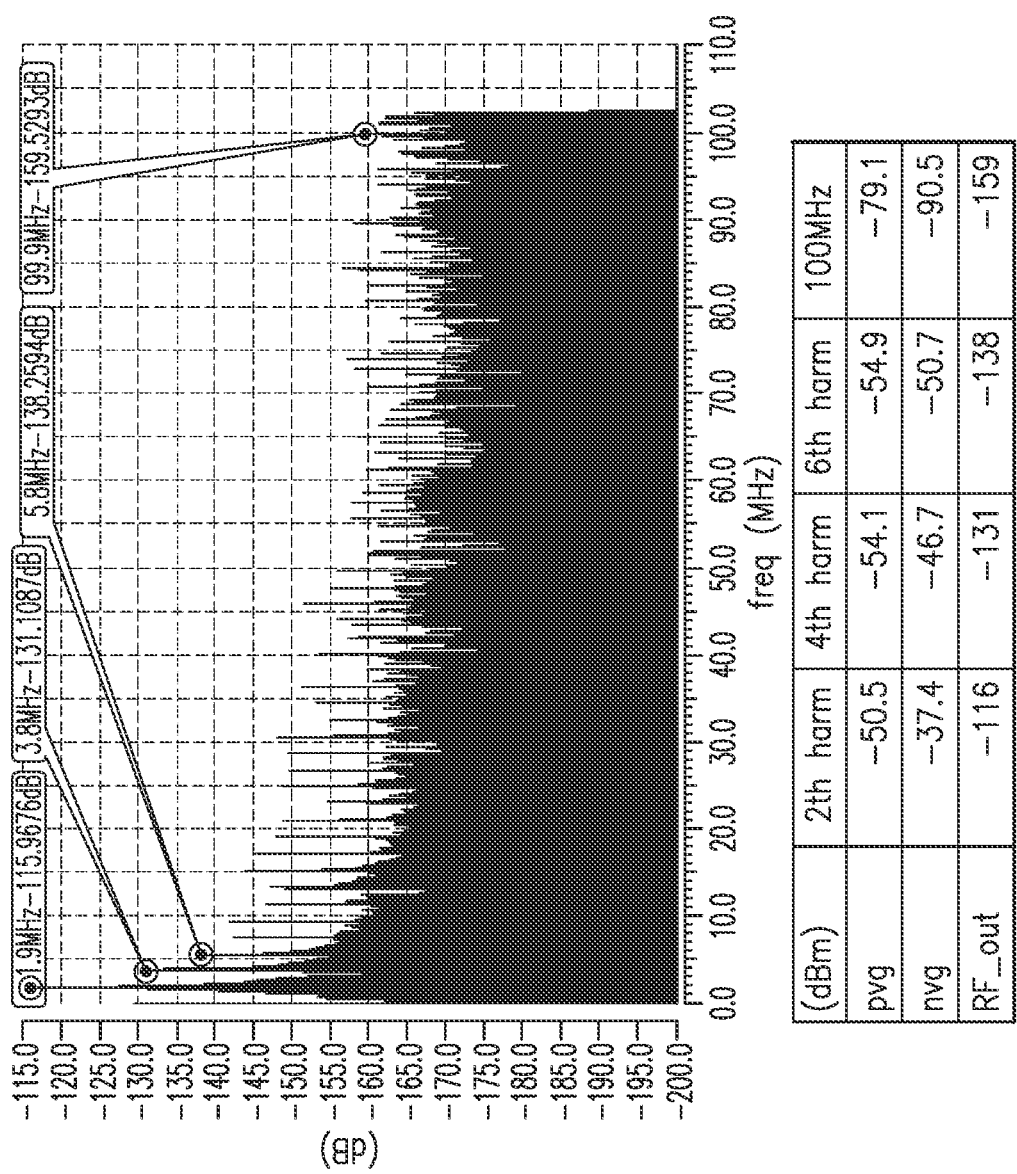
FIG. 11A is a graph of an example noise response of a conventional voltage generator.
Figure 11B:
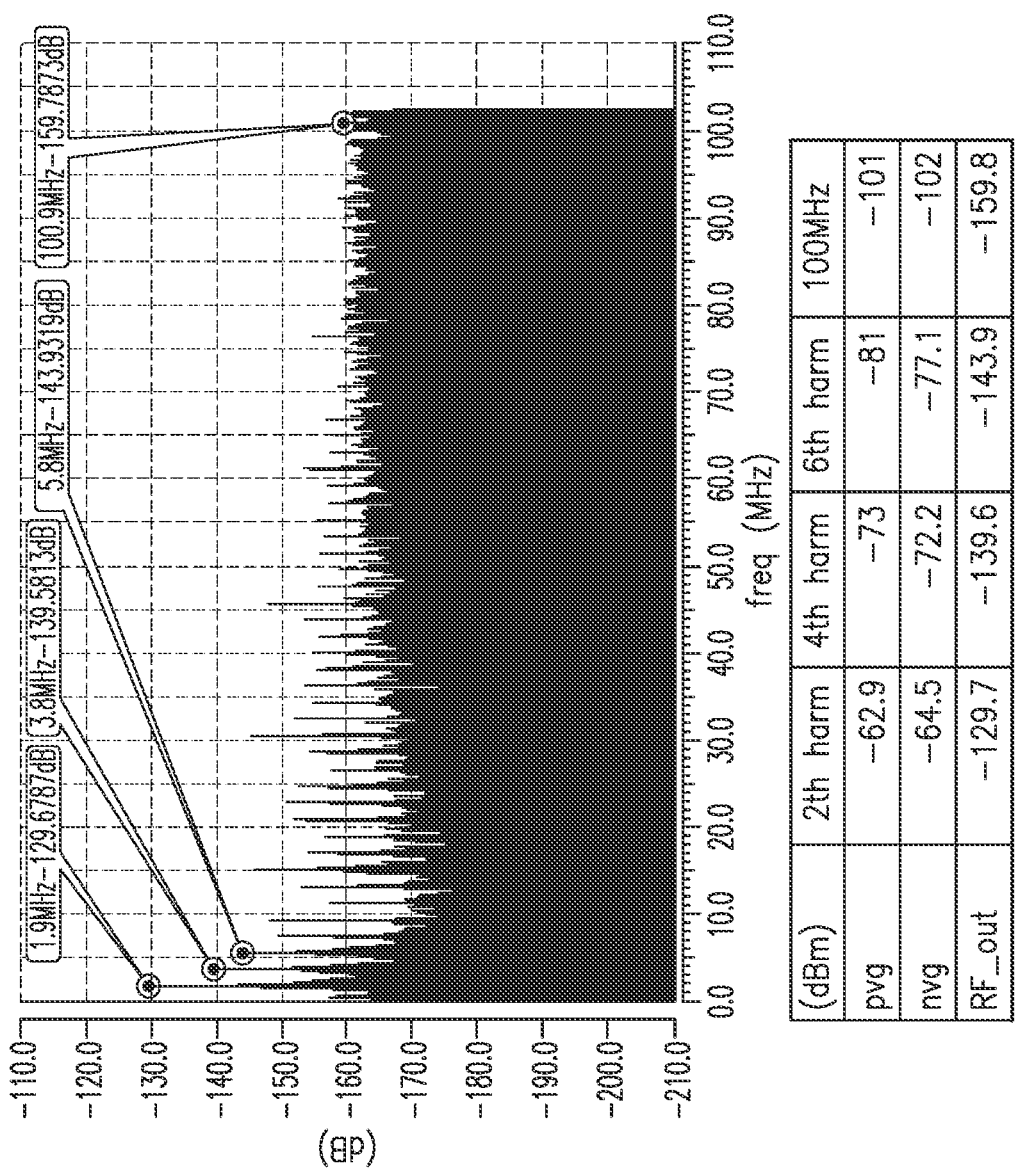
FIG. 11B a is a graph of an example noise response of voltage generator according to one embodiment.

FIG. 11A is a graph of an example noise response of voltage generator with filtering to reduce CFT noise. FIG. 11B a is a graph of an example noise response of voltage generator according to one embodiment. Comparing the tables in FIGS. 11A and 11B, the voltage generator according to an embodiment can achieve a low noise voltage generator. The voltage generator according to an embodiment includes the negative voltage charge pump 206 of FIG. 5A, positive voltage charge pump 208 of FIG. 6A, fly capacitors of FIGS. 9A and 9B, and the level shifter of FIG. 10A, 10B. The FIG. 11B graph indicates an output voltage having less noise than the output voltage as shown in FIG. 11A.

Any of the embodiments described above can be implemented in association with mobile devices such as cellular handsets. Some of the embodiments described above have provided examples in connection with mobile devices. However, the principles and advantages of the embodiments can be used for any other systems or apparatus that have needs for power amplifier systems. Examples of such RF communication systems and apparatus include, but are not limited to, uplink wireless communications devices, mobile phones, tablets, base stations, network access points, customer-premises equipment (CPE), laptops, and wearable electronics.

Figure 12:
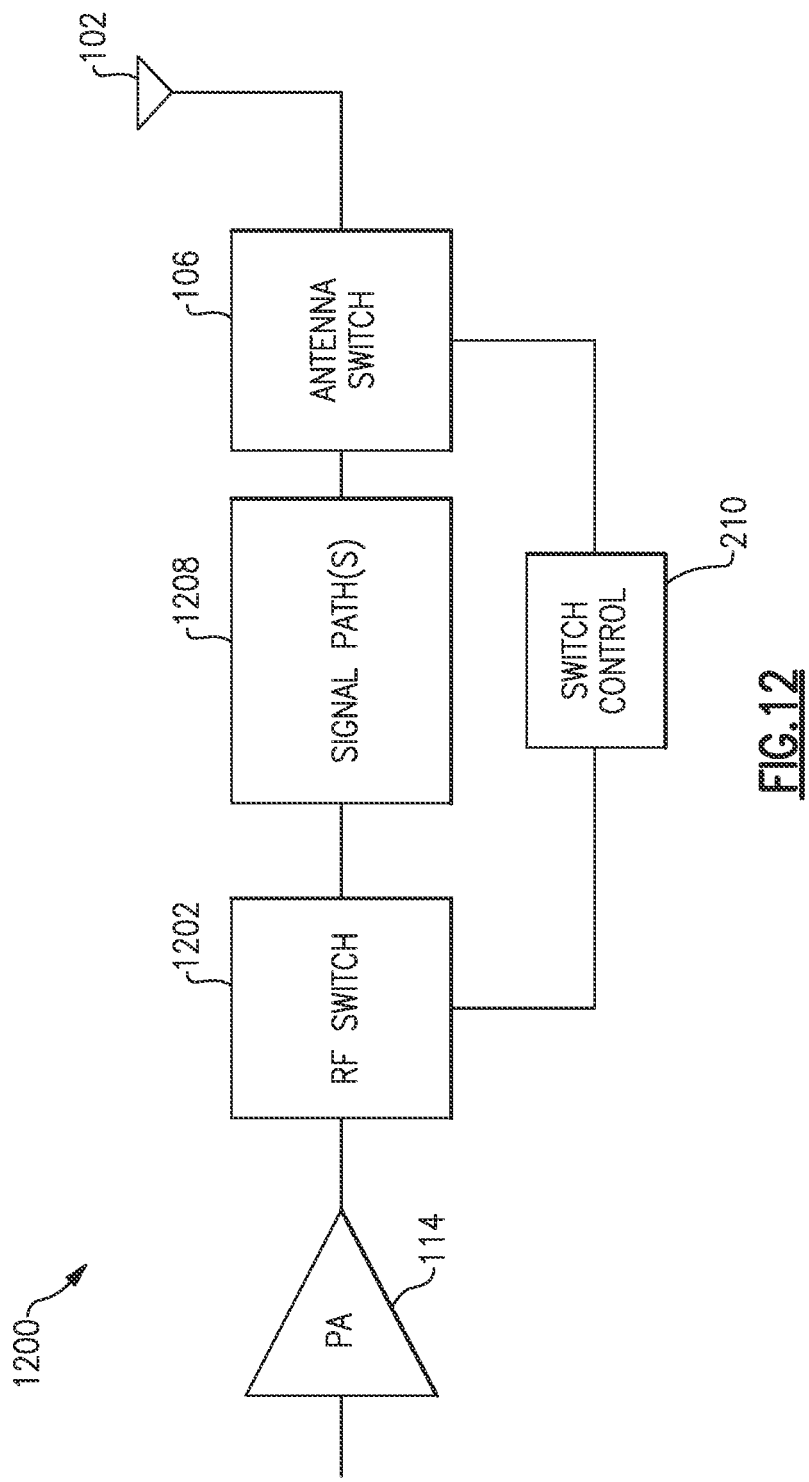
FIGS. 12, 13, and 14 are schematic block diagrams of example RF systems that include an RF switch and a switch control system that includes a voltage generator according to embodiments.
Figure 13:
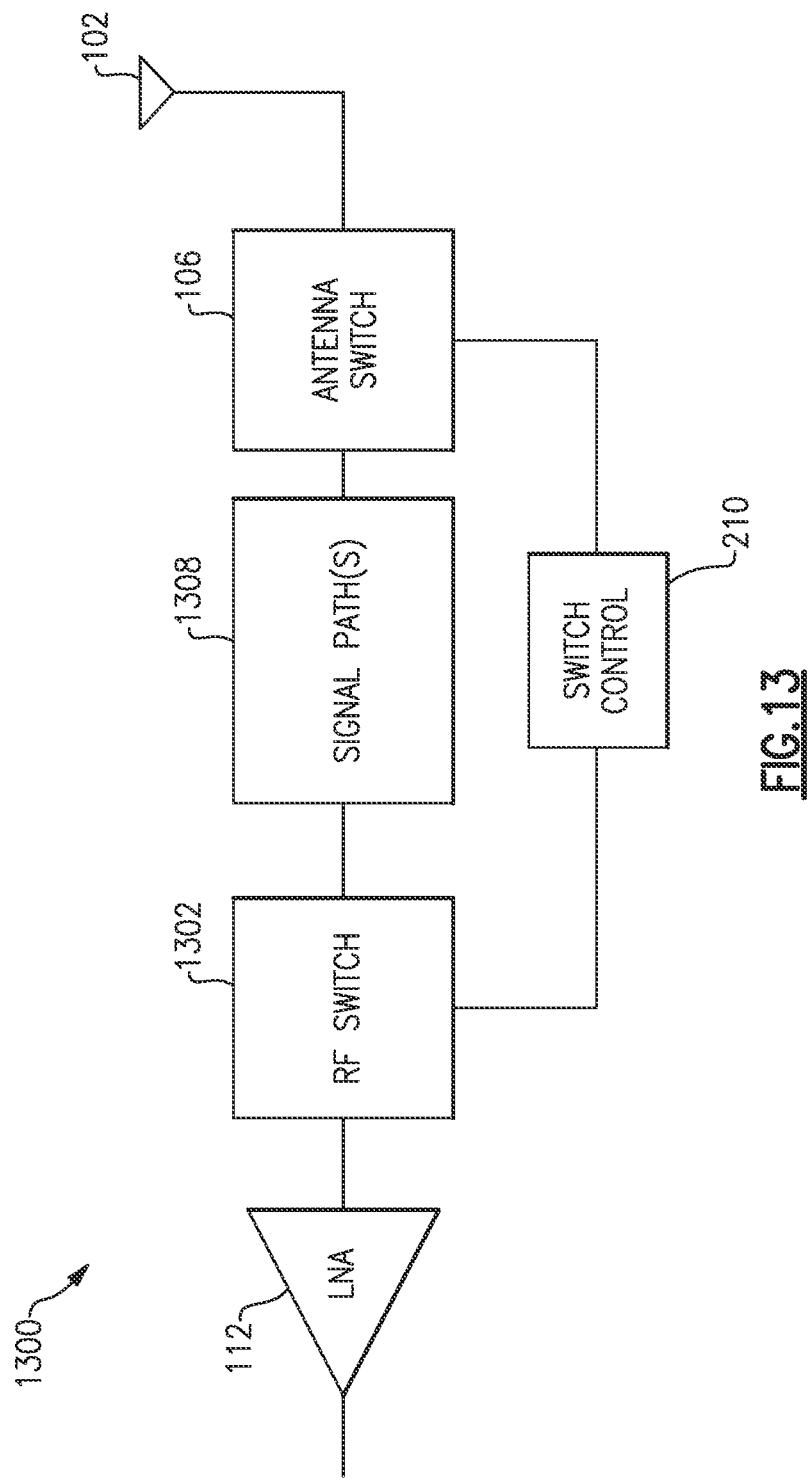
Figure 14:
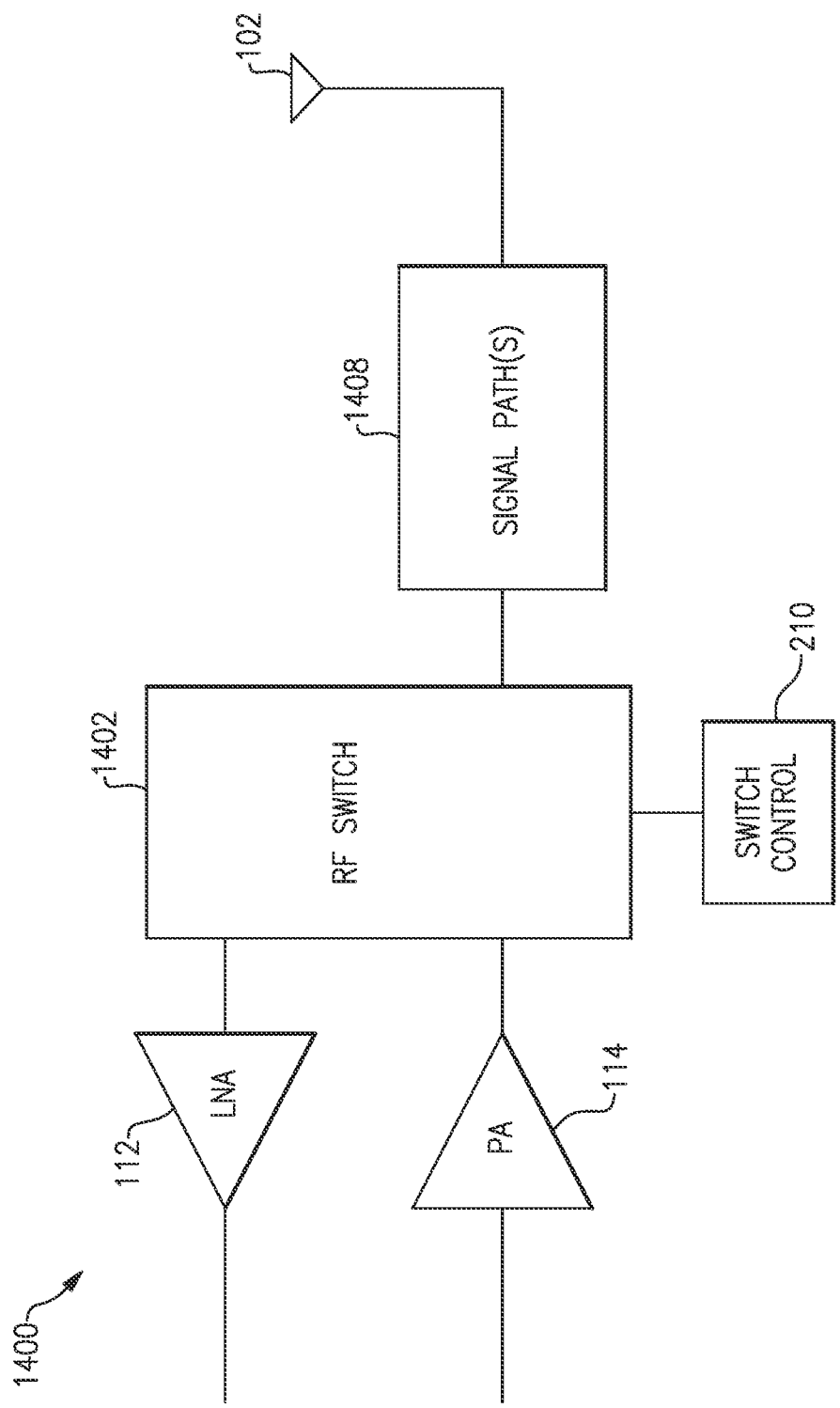

The voltage generators disclosed herein can be implemented in a switch control system in a variety of RF systems. Such voltage generators can generate voltages for controlling a variety of RF switches. Example RF switches can be in a signal path between an RF amplifier, such as a power amplifier or a low noise amplifier, and a filter. RF switches can be implemented on an SOI die in certain applications. FIGS. 12, 13, and 14 are schematic block diagrams of example RF systems that include an RF switch and a switch control system that includes a voltage generator according to embodiments.

FIG. 12 is a schematic block diagram of an RF system 1200 according to an embodiment. As illustrated, the RF system 1200 includes an antenna 102, an antenna switch 106, one or more signal paths 1208, an RF switch 1202, a switch control system 210, and a power amplifier 114. The switch control system 210 can include one or more voltage generators implemented in accordance with any suitable principles and advantages disclosed herein. A voltage generator of the switch control system 210 can generate a voltage for controlling the RF switch 1202. Alternatively or additionally, voltage generator of the switch control system 210 can generate a voltage for controlling the antenna switch 106.

The RF switch 1202 can selectively electrically connect the power amplifier 114 to a signal path 1208 between the RF switch 1202 and the antenna switch 106. The signal path 1208 can include one or more transmit filters and any other suitable circuit elements, such as one or more matching elements, one or more phase shifters, or the like. The signal path 1208 is a transmit signal path. The RF switch 1202 can selectively electrically connect the power amplifier 114 to a transmit filter of the signal path 1208. The transmit filter can be a standalone filter or a filter included in a multiplexer, such as a duplexer. The antenna switch 106 can selectively electrically connect the antenna 102 or an antenna port to a signal path 1208. The antenna switch 106 can be coupled between a transmit filter and the antenna port.

FIG. 13 is a schematic block diagram of an RF system 1300 according to an embodiment. As illustrated, the RF system 1300 includes an antenna 102, an antenna switch 106, one or more signal paths 1308, an RF switch 1302, a switch control system 210, and a low noise amplifier 112. The switch control system 210 can include one or more voltage generators implemented in accordance with any suitable principles and advantages disclosed herein. A voltage generator of the switch control system 210 can generate a voltage for controlling the RF switch 1302. Alternatively or additionally, voltage generator of the switch control system 210 can generate a voltage for controlling the antenna switch 106.

The RF switch 1302 can selectively electrically connect the low noise amplifier 112 to a signal path 1308 between the RF switch 1302 and the antenna switch 106. The signal path 1308 can include one or more receive filters and any other suitable circuit elements, such as one or more matching elements, one or more phase shifters, or the like. The signal path 1308 is a receive signal path. The RF switch 1302 can selectively electrically connect the low noise amplifier 112 to a receive filter of the signal path 1308. The receive filter can be a standalone filter or a filter included in a multiplexer, such as a duplexer. The antenna switch 106 can selectively electrically connect the antenna 102 or an antenna port to a signal path 1308. The antenna switch 106 can be coupled between a receive filter and the antenna port.

FIG. 14 is a schematic block diagram of an RF system 1400 according to an embodiment. As illustrated, the RF system 1400 includes an antenna 102, an antenna switch 106, one or more signal paths 1408, an RF switch 1402, a switch control system 210, a low noise amplifier 112, and a power amplifier 114. The switch control system 210 can include one or more voltage generators implemented in accordance with any suitable principles and advantages disclosed herein. A voltage generator of the switch control system 210 can generate a voltage for controlling the RF switch 1402. The RF switch 1402 can be a transmit/receive switch arranged to selectively electrically connect a signal path 1408 to either the low noise amplifier 112 or the power amplifier 114. The signal path 1408 can include one or more filters and/or multiplexers. The signal path 1408 can include any other suitable circuit elements, such as one or more matching elements, one or more phase shifters, or the like. One or more intervening circuit elements (not illustrated) can be included between the RF switch 1402 and the low noise amplifier and/or the power amplifier 114.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a hand-held computer, a laptop computer, a tablet computer, a home appliance, a vehicular electronics system such as an automotive electronics system, a robot such as an industrial robot, an Internet of things device, etc. Further, the electronic devices can include unfinished products.

Any of the principles and advantages discussed herein can be implemented in association with RF circuits configured to amplify and process signals having a frequency in a range from about 30 kHz to 300 GHz, such as in a frequency range from about 400 MHz to 8.5 GHz. Such radio frequency signals can include wireless local area network signals and/or wireless personal area network signals. Power amplifier systems disclosed herein can generate RF signals at frequencies within Frequency Range 1 (FR1) of a fifth generation (5G) New Radio (NR) specification.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description is not intended to be exhaustive or to limit the embodiments of the disclosure to the precise form disclosed above. While specific embodiments and examples are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage generator with low noise, the voltage generator comprising:

a charge pump including a first set of two switches arranged between two voltages, a second set of two switches arranged between one of the two voltages and an output node, and a fly capacitor connected to the first set of two switches and the second set of two switches; and a clock generation circuit configured to provide clock signals to the charge pump such that (i) the two switches of the first set transition state at different times and (ii) the two switches of the second set transition state at different times, the clock generation circuit including a level shifter configured to generate a level shifted clock signal of at least one of the clock signals, the level shifter including cross coupled transistors.

2. The voltage generator of claim 1 wherein the clock signals have a first phase and a second phase.

3. The voltage generator of claim 1 wherein the clock signals include four clock signals provided to the first and second sets of two switches, and only one of the four clock signals transition at a time.

4. The voltage generator of claim 1 wherein the clock signals cause a first switch of the first set of two switches to transition state only when a second switch of the first set of two switches is in an off state.

5. The voltage generator of claim 1 wherein the two switches of the first set include an N-type switch and a P-type switch.

6. The voltage generator of claim 5 wherein the cross coupled transistors include cross coupled P-type field effect transistors configured to provide the level shifted clock signal.

7. The voltage generator of claim 5 wherein the two voltages are a power supply voltage and ground, and the second set of two switches is connected between ground and the output node.

8. The voltage generator of claim 1 wherein the charge pump generates a negative output voltage.

9. The voltage generator of claim 1 wherein the fly capacitor includes a P-type field effect transistor arranged as a capacitor.

10. The voltage generator of claim 9 wherein the second set of two switches includes an N-type transistor connected between the fly capacitor and the output node.

11. The voltage generator of claim 1 wherein the charge pump generates a positive output voltage.

12. The voltage generator of claim 11 wherein the cross coupled transistors include cross coupled N-type transistors configured to receive a regulated voltage provided to the voltage generator as a supply voltage.

13. The voltage generator of claim 11 wherein the fly capacitor includes a N-type field effect transistor arranged as a capacitor.

14. The voltage generator of claim 13 wherein a P-type transistor of the second set of two switches is connected between the fly capacitor and the output node.

15. The voltage generator of claim 11 wherein the two voltages are a power supply voltage and ground, and the second set of two switches is connected between the power supply voltage and the output node.

16. The voltage generator of claim 1 wherein the level shifter is a voltage doubler.

17. The voltage generator of claim 1 wherein the charge pump further includes a third set of two switches, a fourth set of two switches, and a second fly capacitor connected to the third set of two switches and the fourth set of two switches, the second fly capacitor connected to the output node by way of a switch of the fourth set of two switches.

18. The voltage generator of claim 1 wherein the fly capacitor includes a metal-oxide-semiconductor transistor arranged as a capacitor.

19. A radio frequency system comprising:
a voltage generator including a charge pump and a clock generation circuit; the charge pump including a first set of two switches arranged between two voltages, a second set of two switches arranged between one of the two voltages and an output node, and a fly capacitor connected to the first set of two switches and the second set of two switches; and the clock generation circuit configured to provide clock signals to the charge pump such that (i) the two switches of the first set transition state at different times and (ii) the two switches of the second set transition state at different times, the clock generation circuit including a level shifter configured to generate a level shifted clock signal of at least one of the clock signals, the level shifter including cross coupled transistors;

a switch driver configured to receive an output voltage from the voltage generator and to output a control signal; and a radio frequency switch configured to toggle state based on the control signal, the radio frequency switch configured to pass a radio frequency signal.

20. A method of controlling a radio frequency switch, the method comprising:
generating a voltage using a voltage generator, the voltage generator including a charge pump and a clock generation circuit; the charge pump including a first set of two switches arranged between two voltages, a second set of two switches arranged between one of the two voltages and an output node, and a fly capacitor connected to the first set of two switches and the second set of two switches; and the clock generation circuit configured to provide clock signals to the charge pump such that (i) the two switches of the first set transition state at different times and (ii) the two switches of the second set transition state at different times, the clock generation circuit including a level shifter that generates a level shifted clock signal of at least one of the clock signals using cross coupled transistors; and driving a radio frequency switch with a control signal that is based on the voltage to toggle a state of the radio frequency switch.

* * * * *